United States Patent [19]
Boyd et al.

[11] Patent Number: 6,014,422
[45] Date of Patent: Jan. 11, 2000

[54] METHOD FOR VARYING X-RAY HYBRID RESIST SPACE DIMENSIONS

[75] Inventors: Diane C. Boyd, Lagrangeville, N.Y.; Toshiharu Furukawa, Essex Junction, Vt.; Mark C. Hakey; Steven J. Holmes, both of Milton, Vt.; David V. Horak, Essex Junction, Vt.; William H. Ma, Fishkill, N.Y.; Paul A. Rabidoux, Winooski, Vt.

[73] Assignee: Internaitonal Business Machines Corporation, Armonk, N.Y.

[21] Appl. No.: 09/082,886

[22] Filed: May 21, 1998

[51] Int. Cl.[7] ..................................................... G21K 5/00
[52] U.S. Cl. ............................................. 378/34; 430/967
[58] Field of Search .................... 378/34, 35; 430/966, 430/967

[56] References Cited

U.S. PATENT DOCUMENTS

| | | | |
|---|---|---|---|
| 5,776,660 | 7/1998 | Hakey et al. | 430/296 |
| 5,861,330 | 1/1999 | Baker et al. | 438/237 |
| 5,882,967 | 3/1999 | Brown et al. | 438/237 |
| 5,939,767 | 8/1999 | Brown et al. | 257/551 |

*Primary Examiner*—David P. Porta
*Attorney, Agent, or Firm*—Schmeiser, Olsen & Watts; Eugene I. Shkurko

[57] ABSTRACT

The present invention provides combining the advantages of hybrid resist with the unique properties of x-ray lithography to form high tolerance devices with x-ray pitch and to provide a means for varying the space width and fine tuning to account for process variations. Accordingly, a space width in the hybrid resist can be selectively printed by varying the mask-wafer gap distance, allowing more versatile structures to be formed and adjustments to be made for process changes such as resist composition and ion implant levels.

17 Claims, 21 Drawing Sheets

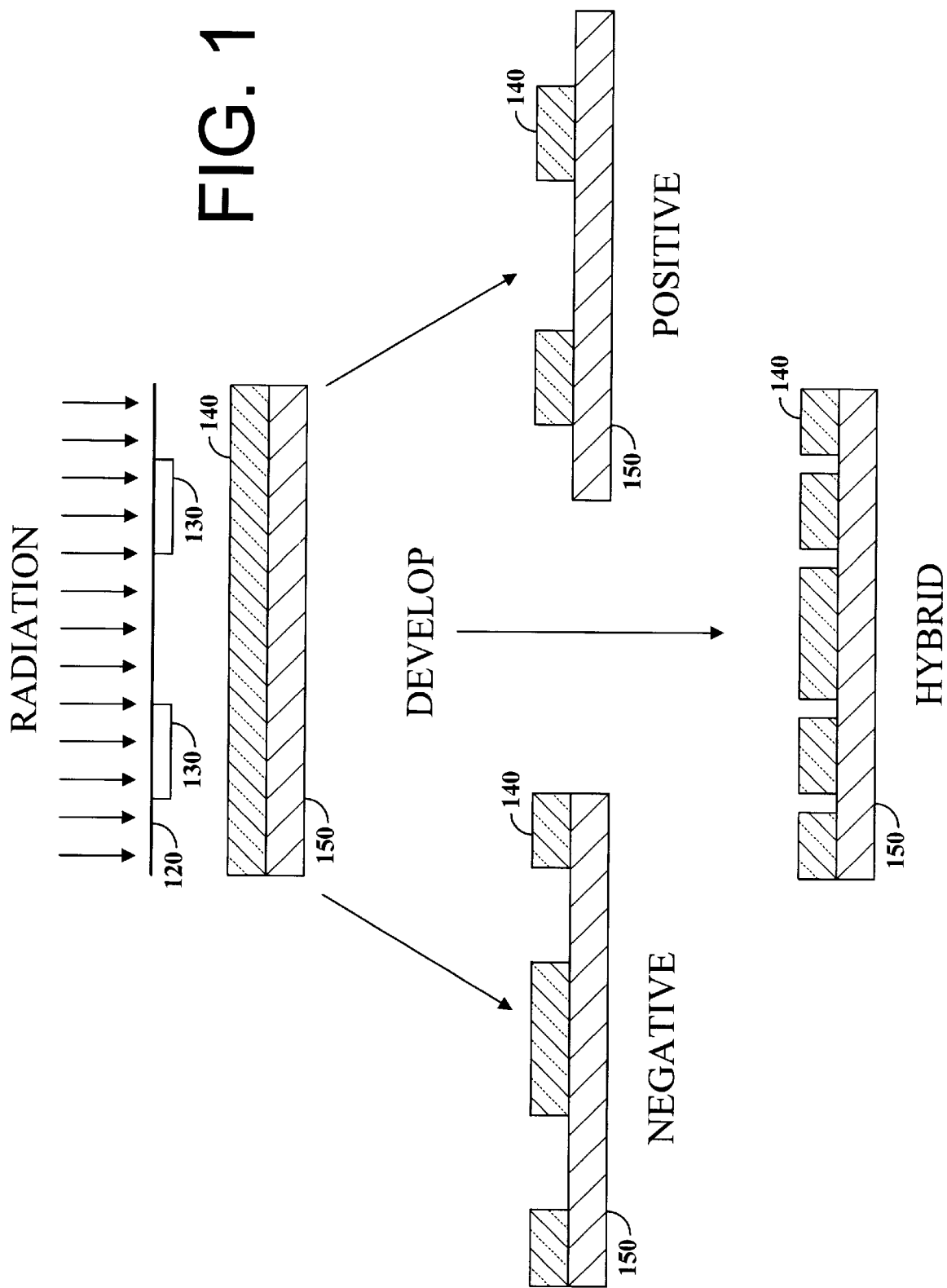

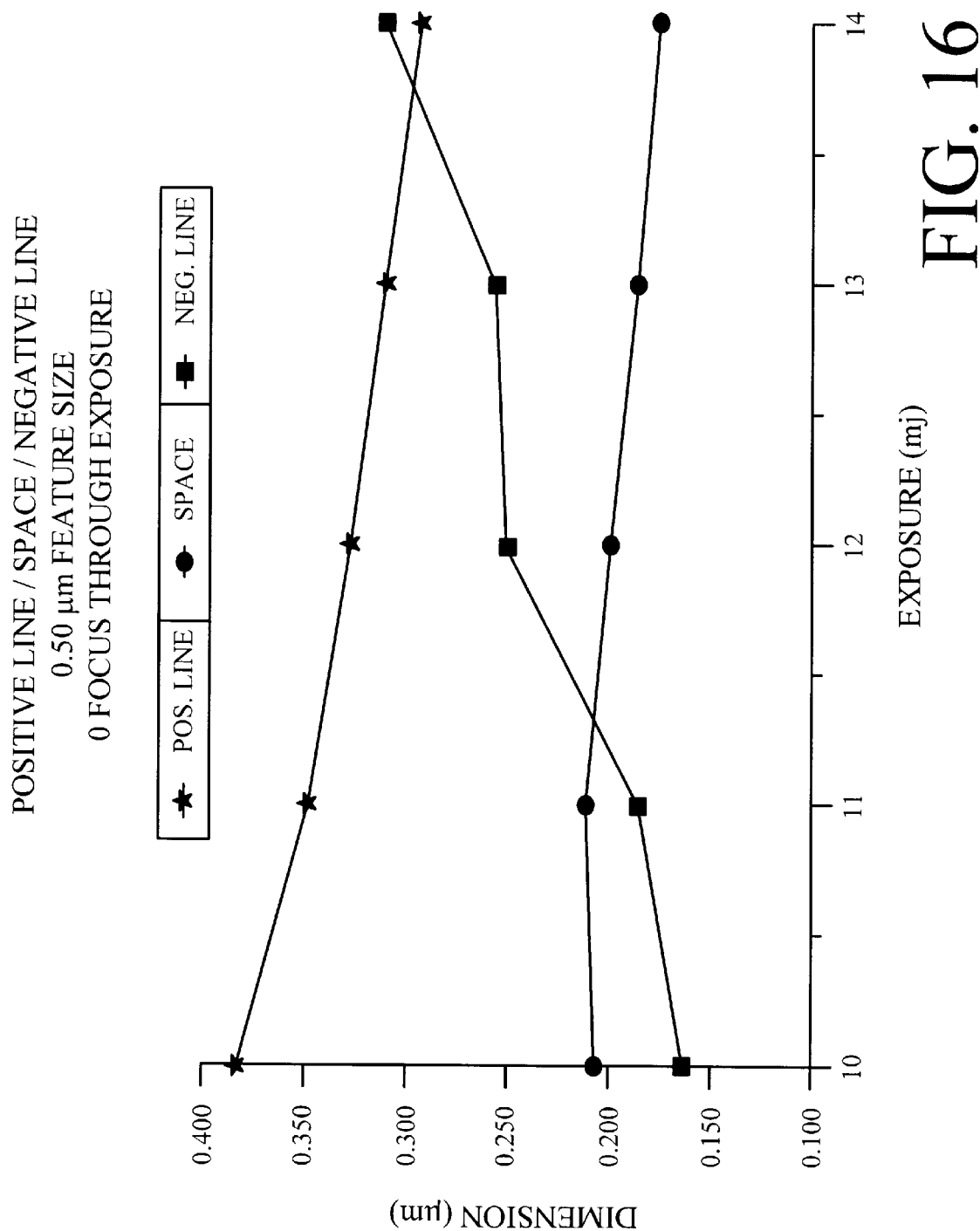

METHOD FOR VARYING X-RAY HYBRID RESIST SPACE DIMENSIONS

RELATED APPLICATIONS

This application is related to the following U.S. Patent applications: "Method of Photolithographically Defining Three Regions with One Mask Step and Self-Aligned Isolation Structure Formed Thereby," Ser. No. 08/895,748, filed Jul. 17, 1997, "Method for Forming Sidewall Spacers Using Frequency Doubling Hybrid Resist and Device Formed Thereby," Ser. No. 08/895,749, filed Jul. 17, 1997, "Low 'K' Factor Hybrid Photoresist," Ser. No. 08/715,288, filed Sep. 16, 1996, and "Frequency Doubling Photoresist," Ser. No. 08/715,287, filed Sep. 16, 1996.

BACKGROUND OF THE INVENTION

1. Technical Field

The present invention relates generally to the field of semi-conductor manufacturing and, more specifically, to a method for optimizing the use of x-ray lithography in conjunction with hybrid resists.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced. For the past 20 years, optical lithography has driven the device density and the industry has resorted to optical enhancements to allow increasing densities. As an example, some such enhancements include overexposing/overdeveloping, hard and soft phase shifts, phase edge masks, and edge shadowing. Unfortunately, the latest of such enhancements tend to offer only minor increases in density and the limit of optical enhancements appears inevitable in the near future.

The same industry trend to increase device density is also causing a transition to x-ray lithography. X-rays are a desirable type of exposure radiation because the wavelength of x-rays (about 8 Å) is smaller than the wavelength of ultra-violet radiation typically used to fabricate dense integrated circuits. The smaller wavelength allows for exposure of a resist through a mask having a smaller image than in optical lithography. However, certain aspects of x-ray lithography are insufficiently advanced to satisfy the current demand for increasing device density.

In optical lithography, projection printing allows the mask image to be projected onto the resist at a reduced size to increase the possible device density. For example, a 4× reduction is typical. However, sufficient success has not been achieved in attempts to fabricate lenses for reducing the size of the x-ray mask image to a smaller aerial image. Accordingly, even though the potential exists for exposing a 0.05 μm aerial image onto the resist using x-ray lithography, it requires a mask having a 0.05 μm image. Producing such a mask within required tolerances can be a formidable task and constitutes the most significant disadvantage of x-ray lithography. In fact, the tolerances that are achieved in the x-ray mask dictate the tolerances that can be achieved in a product produced using x-ray lithography.

The smaller images on a x-ray mask are more difficult to fabricate than the larger images on an optical mask because of the smaller image size and different materials. The smaller size requires electron beam lithography (EBL) to carve out the image and EBL has not yet advanced sufficiently to produce masks that take full advantage of the smaller wavelength. Further, instead of a chrome mask layer used in optical lithography, the nature of x-rays requires tungsten, gold, or other material with a high x-ray extinction coefficient that must also be much thicker than the typical chrome layer. Unfortunately, the high x-ray extinction materials are difficult to control within tolerance and the thickness increases the difficulty of mask fabrication.

Also, x-ray lithography involves proximity printing the mask image onto the resist. Proximity printing simply means that the mask is in close proximity to, but not in contact with, the surface of the resist layer. The gap distance between the mask and the wafer is minimized to produce an aerial image through the mask with as high a contrast possible. That is, the gap distance is decreased so that the transition from zero intensity to full intensity occurs over a smaller area. Typical gap distances are between 10 and 50 μm.

The pitch, or combined width of an adjoining line and space in a semiconductor, can theoretically be very small when x-ray lithography is used, but the poor tolerance of the x-ray mask prevents the precise formation of reliable devices at x-ray pitch. Even though the possibility of x-ray pitch exists, abnormalities in the x-ray mask will yield abnormalities in lines and spaces sufficient to preclude fabricating reliable devices as small as allowed by the small x-ray wavelength. It would be an improvement in the art to provide a method for forming high tolerance devices with x-ray pitch. Such a method must yield few enough abnormalities in lines and spaces to provide performance of the final product within industry standards. Without a method for forming high tolerance devices at x-ray pitch, the value of x-ray lithography for increasing device density is seriously diminished and advancement in improving chip cost and performance may stagnate.

DISCLOSURE OF INVENTION

Accordingly, the present invention provides a method for defining high density features on semiconductor devices. The novel method uses hybrid resist and x-ray lithography to define these features. The method avoids the problems in accurately forming x-ray masks at the feature size dimensions by using the unique properties of hybrid resist to form spaces in the resist where an intermediate exposure occurs, in other words, to use an edge printing technique. These spaces have a dimension that is independent of the feature size of the mask and is smaller than the typical feature size of a conventional x-ray mask. Thus, the present invention is able to consistently form small, high tolerance features using x-ray lithography without requiring equally small and high tolerance mask shapes in the x-ray mask. The present invention method uses adjustments in the mask-wafer gap distance during x-ray exposure to form spaces in hybrid resist of a desirable dimension. In particular, the size of a space formed in hybrid resist is determined by the aerial image which, in turn, is varied by adjusting the gap distance during exposure. This can be used to provide accurate patterning of hybrid resist with different space widths. Additionally, this method can be used to compensate for process variations that would otherwise cause unwanted changes in space widths.

Within a range of about 10–50 μm as the mask-wafer gap distance, one can take advantage of the combined properties of x-ray and hybrid resist to increase the space width in the resist by increasing the gap distance between the mask and wafer. In this sense, the gap distance is not the problem, but rather the solution to the need for varying the hybrid resist space width and fine tuning to account for process variations. In addition, a x-ray hybrid resist yields high tolerance lines and spaces largely independent of a low tolerance x-ray mask. Only the transition from exposed resist to unexposed resist at the edge of the x-ray aerial image is involved in producing a corresponding space. The width of the space produced is generally not dependent on the size of the mask image. Thus, an x-ray mask image wherein the reticle opening is either too small or too large and causes a fatal defect in a typical resist might not yield such an effect in a hybrid resist. Accordingly, a space width in the hybrid resist can be selectively printed by varying the mask-wafer gap, allowing more versatile structures to be formed and adjustments to be made for process variations such as resist composition and ion implant levels.

It is an advantage of the present invention that space width can be varied in the production of high tolerance spaces at x-ray pitch.

It is an additional advantage that adjustments can be made in space dimensions at x-ray pitch to compensate for process variations.

The foregoing and other advantages and features of the invention will be apparent from the following more particular description of a preferred embodiment of the invention, as illustrated in the accompanying drawings.

BRIEF DESCRIPTION OF DRAWINGS

The preferred embodiments of the present invention will hereinafter be described in conjunction with the appended drawings, wherein like designations denote like elements, and:

FIG. 1 is a schematic diagram showing the use of the hybrid resist;

FIG. 16 is a graph of the response of a formulation of the hybrid resist of the present invention in which exposed (negative) line, unexposed (positive) line and space widths are plotted as a function of exposure dose;

BEST MODE FOR CARRYING OUT THE INVENTION

Figure 3:
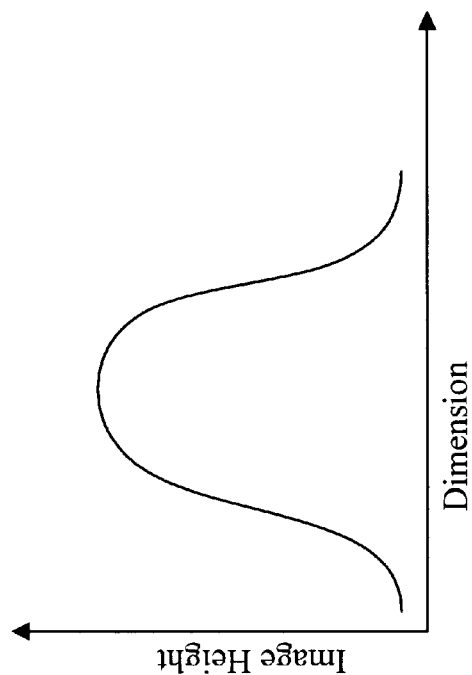
FIG. 3 is a graph illustrating the line pattern for positive resist printed with a reticle line pattern.

The preferred embodiment of the present invention overcomes the limitations of current technology by combining the advantages of hybrid resist with the unique properties of x-ray lithography. The present invention provides a method to produce high tolerance devices with x-ray pitch (the combined width of an adjoining line and space achieved using x-ray lithography) and a means to vary the width of spaces produced in a hybrid resist and to fine tune to account for process variations. Normally, the aerial image sharpness is a problem in x-ray lithography and the smallest possible mask-wafer gap distance is desired to yield an image with the highest contrast. The present invention method uses adjustments in the gap distance during x-ray exposure to form spaces in hybrid resist of a desirable dimension. In particular, the size of a space formed in hybrid resist is determined by adjusting the gap distance during exposure.

This can be used to provide accurate patterning of hybrid resist with different space widths. Additionally, this method can be used to compensate for process variations that would otherwise cause unwanted changes in space widths. A description of hybrid resist will now be given, followed by a description of the preferred embodiments.

Hybrid Photoresist

The preferred embodiment uses photoresist material having, simultaneously, both a positive tone and a negative tone response to exposure. This combination of materials can provide a new type of resist, which we call a hybrid resist.

As a hybrid resist is exposed with actinic radiation, areas exposed with high intensity radiation form a negative tone line pattern. Areas which are unexposed remain insoluble in developer, thus forming a positive tone line pattern. Areas which are exposed with intermediate amounts of intensity, such as the edges of the aerial image where diffraction effects have reduced the intensity, form a space in the resist film during develop. This resist response is an expression of the unique dissolution rate properties of this resist, in which unexposed resist does not develop, partially exposed resist develops at a high rate, and highly exposed resist does not develop.

The unique dissolution rate response of the hybrid photoresist allows a single aerial image to be printed as a space/line/space combination rather than as a single line or space, as with conventional resist. This 'frequency doubling' capability of this resist allows conventional expose systems to be extended to higher pattern densities. It is an advantage of one example of hybrid resist that lines and spaces of 0.2 μm and less can be printed with current deep ultra violet (DUV) lithography tools that are designed for operation at 0.35 μm resolution.

It is a further advantage of this type of hybrid resist that the space width is generally unchanging as the exposure dose and the reticle image size are changed. This allows very precise image control for the space width within each chip, across each wafer, and from one batch of product wafers to the next.

Still another advantage the hybrid resist is the relaxation of the minimum reticle feature size due to the frequency doubling capability of hybrid resist. For example, to print a 0.2 μm feature with conventional resist generally requires a 0.2 μm reticle image size. With hybrid resist, a 0.2 μm space can be formed with a single edge of a reticle feature; for example, a 0.5 μm reticle opening could produce two 0.2 μm spaces and a 0.2 μm line. In this way, one could accomplish 'reduction' x-ray or E-beam lithography; the reticle image pitch could be approximately 2× the printed pitch on the substrate. This also has the additional advantage of allowing a relaxation of the image size requirements of optical reticles, reducing cost and improving yield of the reticle. It is an advantage of hybrid resist that lines and spaces of 0.2 μm and less may be achieved without altering the present optical lithography tools.

It is a further advantage that the space width is generally unchanging as the exposure dose and reticle sizes change, thereby allowing greater process latitude for control of space width. Through the use of the hybrid resist of the present invention, errors in the image dimension on the reticle are not reproduced in the space width printed on the substrate. As a result, the across-chip space width variation is minimized. This is valuable for optical, X-ray and e-beam exposure methods. It is especially useful in lithographic techniques that require a 1× reticle, i.e., a reticle that normally has a one-to-one relationship with the image printed on the substrate, because variations in the image size on the reticle are normally reproduced on the substrate.

Figure 2:
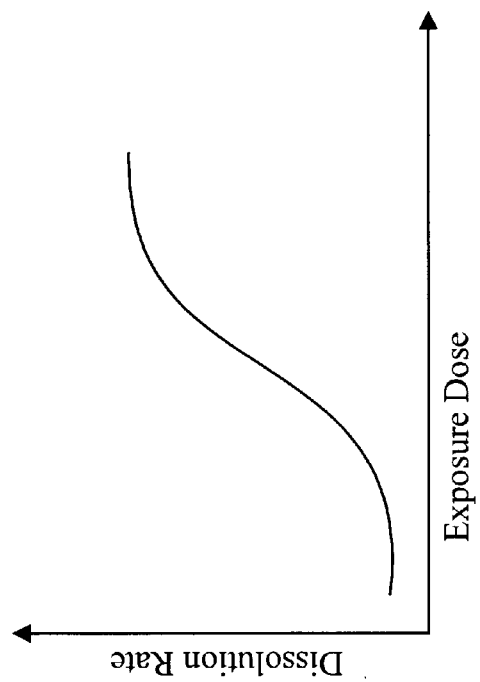
FIG. 2 is a graph is illustrating how positive resist undergoes an increase in solubility as the exposure dose is increased.

Accordingly, the preferred embodiment hybrid resist provides a photoresist material having, simultaneously, both a positive tone and a negative tone response to exposure. The positive tone response dominates at the lower exposure dose while the negative response predominates at the higher exposure dosages. Exposure of this resist creates a space/line/space combination, whereas either of the conventional resists would produce only a single feature. Turning to FIG. 2, a graph is illustrated showing how positive resist undergoes an increase in solubility as the exposure dose is increased. Turning to FIG. 3, the line pattern for positive resist printed with a reticle line pattern is illustrated.

Figure 5:
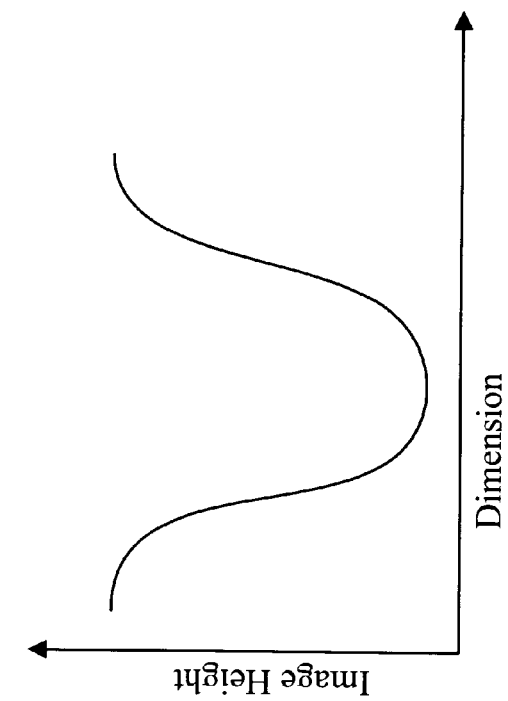
FIG. 5 is a graph illustrating the line pattern for negative resist printed with a reticle line pattern.
Figure 4:
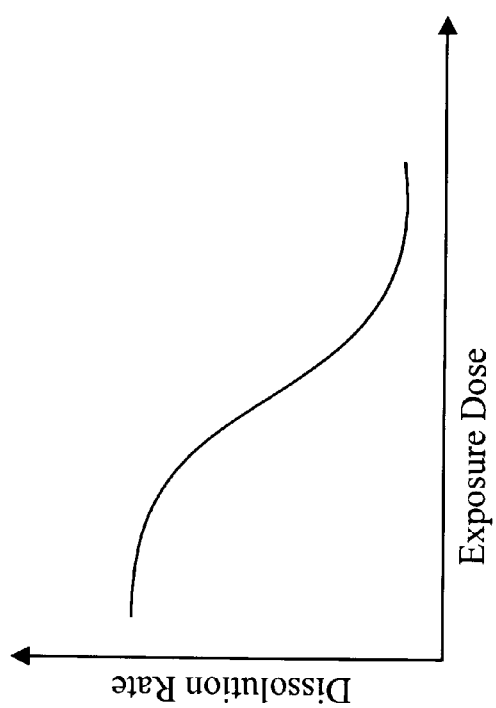
FIG. 4 is a graph illustrating how in negative resist systems exposed areas undergo a reduction in solubility as the exposure dose is increased.

On the other hand, in the negative resist system exposed areas undergo a reduction in solubility as the exposure dose is increased, as illustrated in FIG. 4. Turning to FIG. 5, the line pattern for negative resist printed with a reticle line pattern is illustrated.

Figure 7:
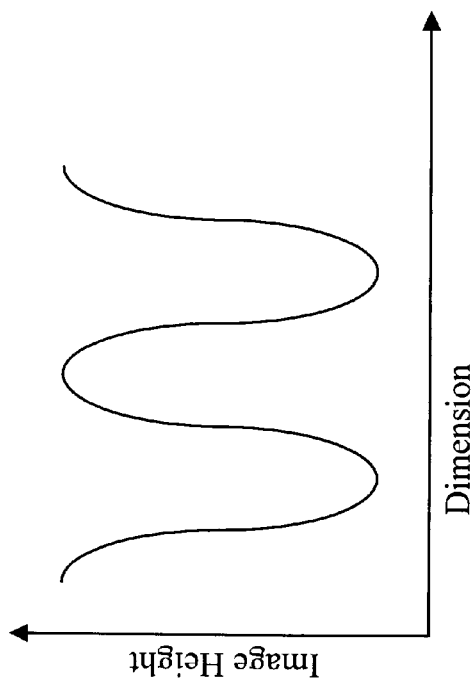
FIG. 7 is a graph illustrating the space/line/space pattern formed onto a substrate using hybrid resist.
Figure 6:
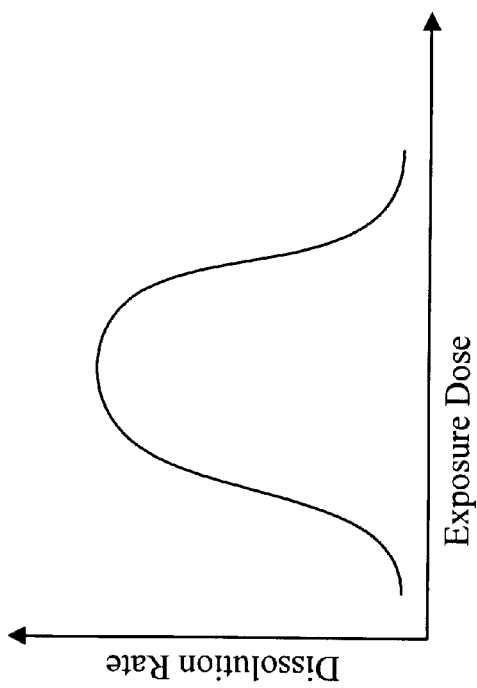
FIG. 6 is a graph of the resist solubility as a function of exposure dose for hybrid resist.

For the hybrid resist of the present invention, the positive tone response causes an increase in solubility in the areas where diffraction effects have reduced the exposure intensity, such as the areas near the edge of the reticle image. As the exposure dose is increased, the negative tone response predominates, causing a reduction in solubility in the more highly exposed areas. Turning to FIG. 6, the graph of the resist solubility as a function of exposure dose for hybrid resist is illustrated. Printing a reticle line pattern onto a substrate results in the space/line/space pattern illustrated in FIG. 7.

In this manner, the aerial image is "frequency doubled" to produce twice the number of features than would otherwise be attainable with the standard resist. FIG. 1 illustrates these salient differences between a positive resist, a negative resist, and a hybrid resist. In FIG. 1, a photoresist 140 has been deposited over the surface of substrate 150. A mask 120 with chrome areas 130 is used to selectively mask portions of photoresist 140 from an optical radiation source. After exposure, photoresist 140 is developed and portions subsequently removed by washing the surface of the wafer. Depending on the nature and composition of photoresist 140, a certain pattern, which is related to chrome areas 130 on mask 120, will be formed in photoresist 140. As shown in FIG. 1, a positive photoresist will leave areas that correspond to chrome areas 130. A negative photoresist will create a pattern whereby the areas that correspond to chrome areas 130 are removed from substrate 150. A hybrid photoresist material will leave a photoresist pattern that corresponds to removal of the photoresist material from the areas of substrate 150 that are associated with the edges of chrome areas 130.

The frequency doubling hybrid resist is typically formulated using components of existing positive and negative tone resists. This includes, for example, poly (hydroxystyrene) resins which are partially modified with acid-sensitive solubility dissolution inhibiting functionalities, a cross-linker, a photo-acid generator, and, optionally, a base additive and a photosensitizer.

The resist formulations may be varied to obtain a fast positive tone reaction and a slow negative tone reaction for optimal results. Additionally, the positive tone component can be chosen such that it is relatively insensitive to post expose bake temperatures, while the negative tone portion is chosen to be more highly sensitive to post expose bake temperatures. In this way, the relative sensitivity of the positive and negative responses can be altered with bake temperatures to provide the desired imaging results.

Figure 10:
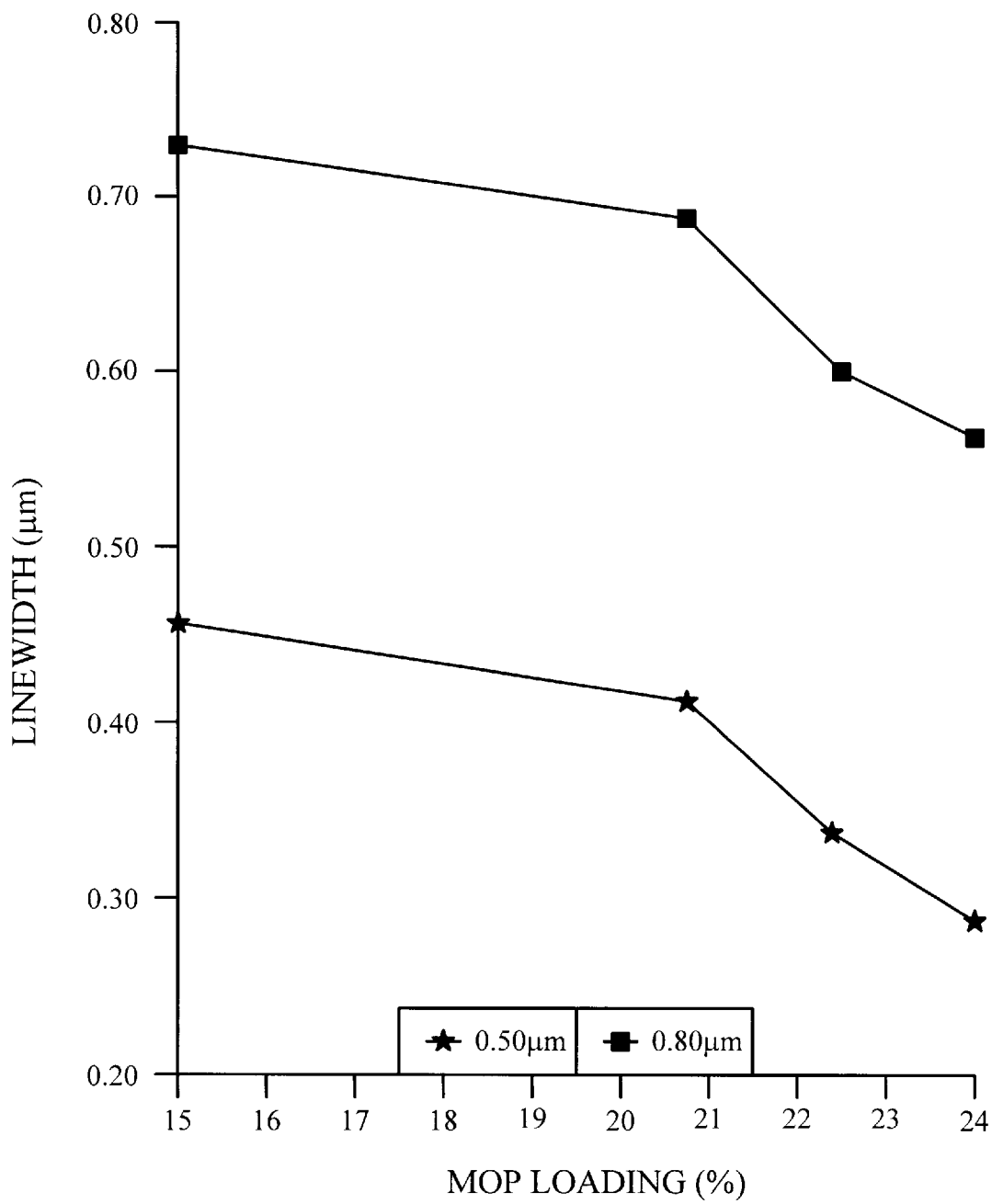
FIG. 10 is a graph showing the linewidth in nm plotted against the amount of positive tone solubility inhibitor (MOP) incorporated in a hybrid resist of the present invention.
Figure 15:
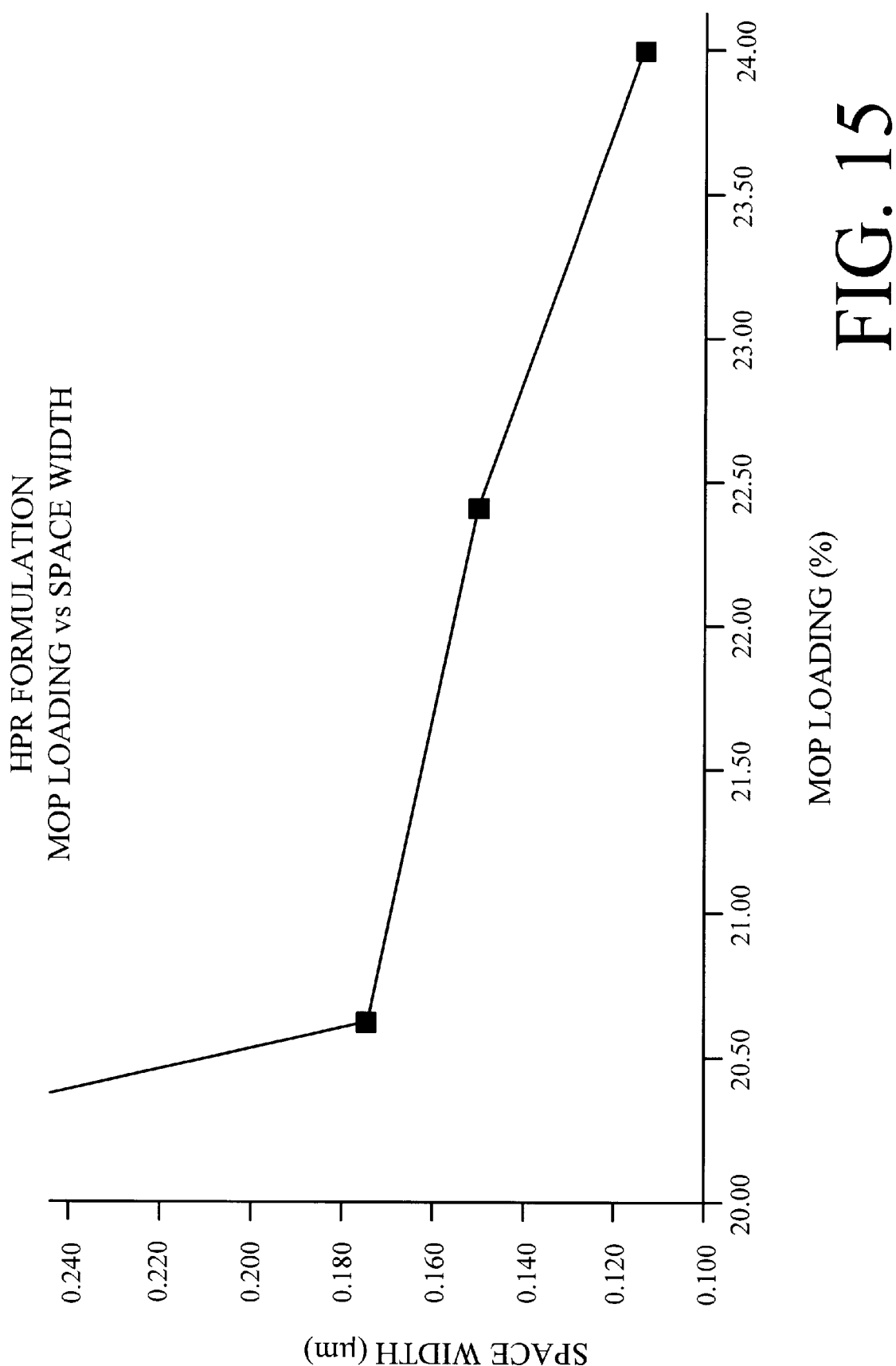
FIG. 15 is a graph showing the variation in space width in $\mu$m as a function of MOP loading using one formulation of hybrid resist of the present invention.

In addition, the resist formulations may be altered to provide space widths of different dimensions. For example, as the amount of solubility inhibitor on the poly (hydroxystyrene) resin is increased, the printed space width becomes smaller (FIG. 15). This approach may also be used to alter the isofocal print bias of the negative tone line; at higher positive tone solubility inhibitor concentrations, the isofocal print bias of the negative tone line increases (FIG. 10). This is desirable in some applications for reducing the size of the printed negative tone line, optimizing the frequency doubling characteristics of the resist.

The relative responses of the positive and negative tone functions of the hybrid resist can also be altered by modifying the exposure conditions. For example, the negative tone line of the hybrid resist does vary with exposure dose and reticle dimension, similar to the behavior of a conventional resist. Thus, as exposure dose is increased, for example, the negative tone line increases in width, and the spaces remain the same size, but the spaces are shifted to a new position on the substrate, since they lie adjacent to the negative line. Similarly, the positive tone lines alter in size as the exposure dose or reticle dimension are altered.

As another example, two reticles could be used to print two separate patterns in the resist. One reticle could be exposed with a high dose, causing the hybrid functions to be expressed in the resist. Another reticle could be exposed in the same resist film at a lower dose, causing only the positive tone function to be expressed in that portion of the resist. This effect could also be accomplished with a single expose process if, for example, the reticle contained a partial filter of the actinic radiation in the areas where a lower exposure dose was desired. This allows wider spaces to be printed at the same time as the narrower features, which is necessary in some device applications.

In a modification of this two-step imaging approach, a hybrid resist can be used to create a standard negative tone pattern. If the resist film is image-wise exposed with a standard negative tone reticle, baked to form the hybrid image, then blanket exposed with actinic radiation and developed without a second post-expose bake process, the result is a standard negative tone image. This approach may be desirable in some applications, such as the formation of gate conductor circuits, which require very small lines to be printed, but do not require a high density image pitch. As an alternative to this method, the resist may be blanket exposed to a low dose of actinic energy after the image-wise exposure and before the baking step. The desirability of the method would depend on whether a solubility inhibiting protective group is present on the resin and whether the positive tone response is temperature dependent.

Figure 8:
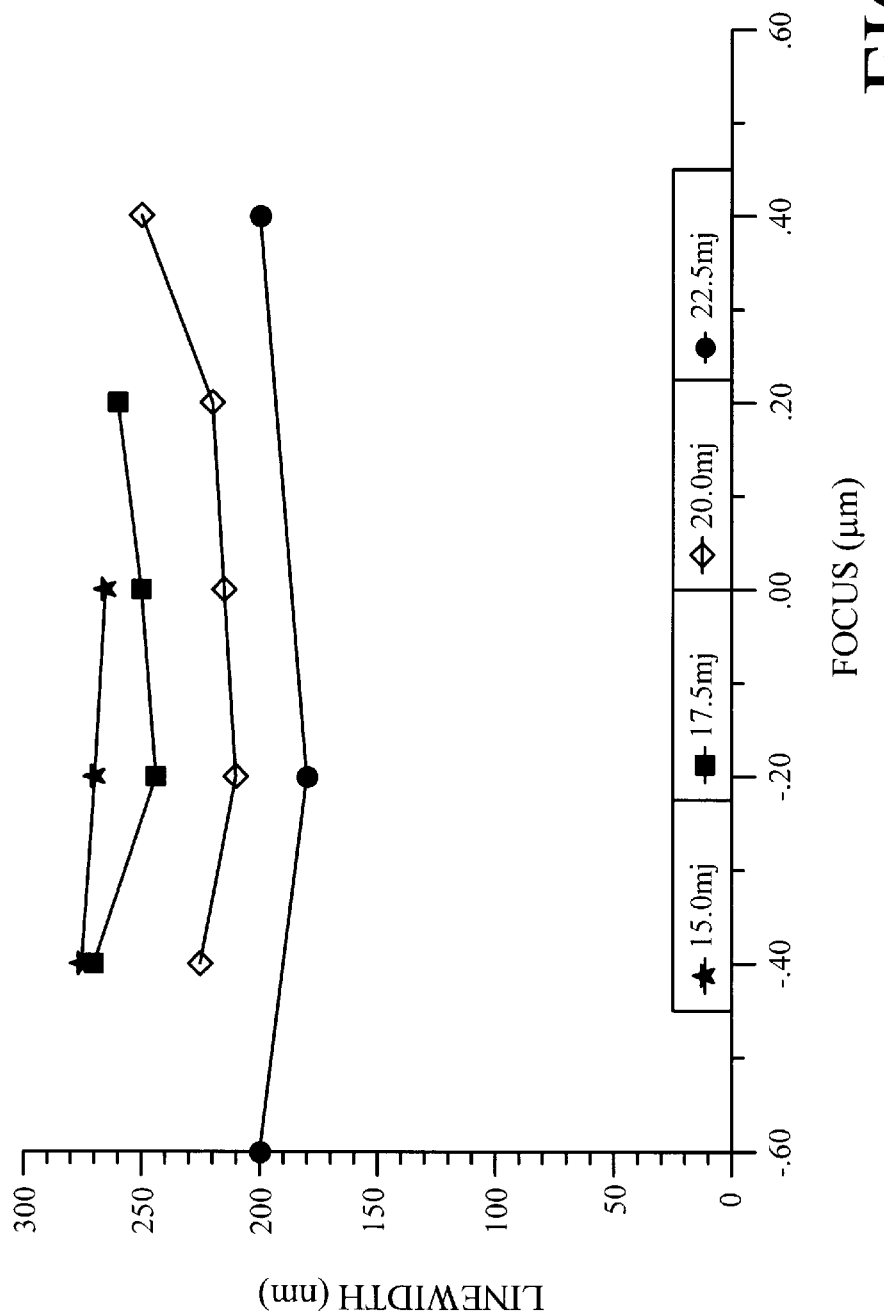
FIG. 8 is a graph of linewidth in nanometers (nm) plotted against focus in microns ($\mu$m) of a formulation of a standard negative resist at various exposure energies.
Figure 9:
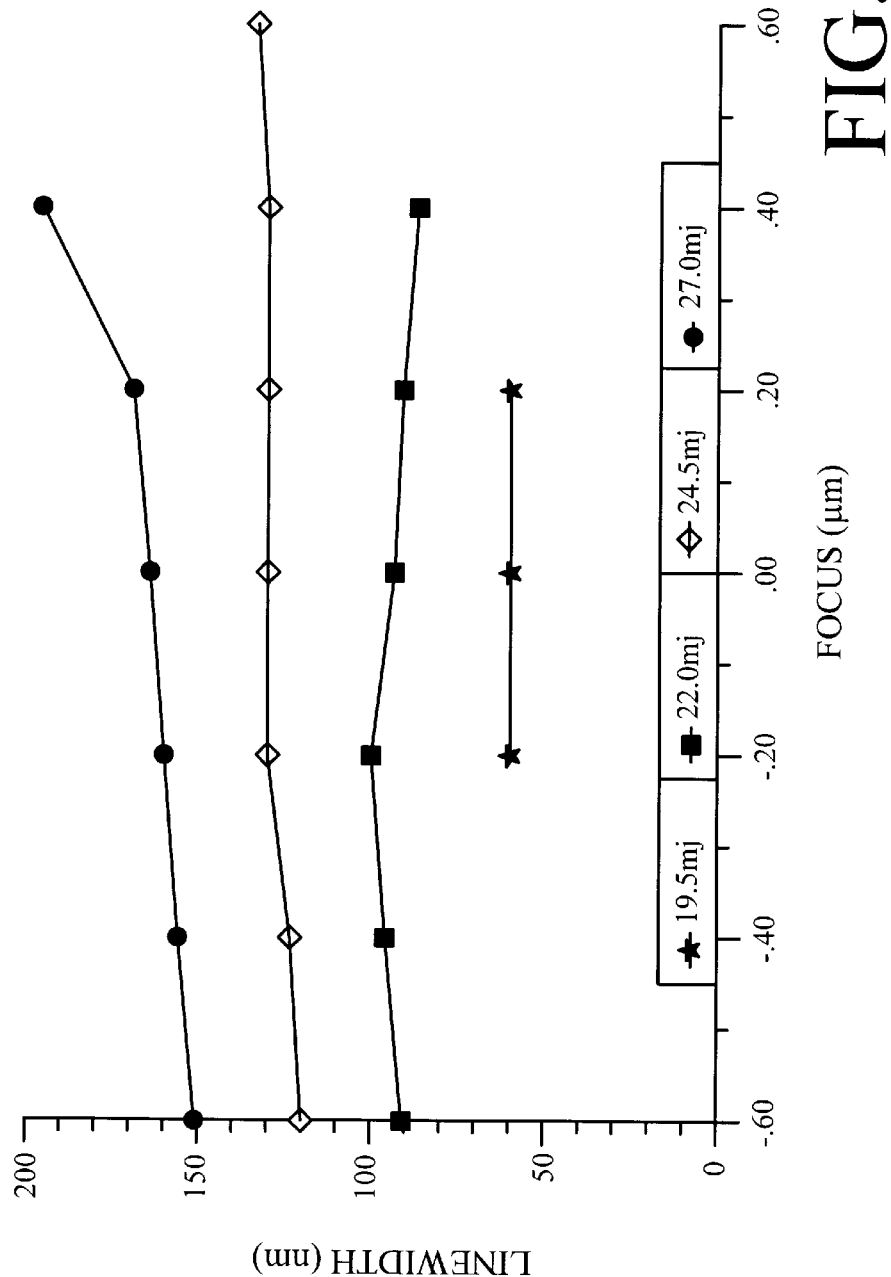
FIG. 9 is a graph of linewidth for a negative tone line of a hybrid pattern in nm plotted against focus in $\mu$m of a hybrid resist of the present invention at various exposure energies.

An advantage of using the hybrid resist in such applications is that the negative tone line of the hybrid resist can exhibit a large print bias at its isofocal point, as shown in FIG. 9. In other words, at the point of largest process latitude for the hybrid negative tone line, the resist image size can be substantially smaller than the reticle image size. This is desirable because the aerial image is less degraded by diffraction effects at the larger reticle size, thus allowing a larger depth of focus in optical lithography to be attained than is possible with conventional positive and negative tone systems, as shown in FIG. 8. This print bias is a result of the fact that the edge of the chrome line prints as a space. The space, in effect, acts to 'trim' the edges of the aerial image, causing the negative line to print smaller than it would with a conventional negative resist. This is an expression of the frequency doubling character of a hybrid resist.

It is possible to design the resist formulation to optimize the print bias of the negative tone line. For example, by choosing an appropriate loading factor for the positive tone solubility inhibitor, one may obtain a particular print bias as shown in FIG. 10. In theory, it is quite obvious that similar variations in the photoresist response can also be brought about by making appropriate changes in concentrations and reactivities of other components as well.

Figure 11:
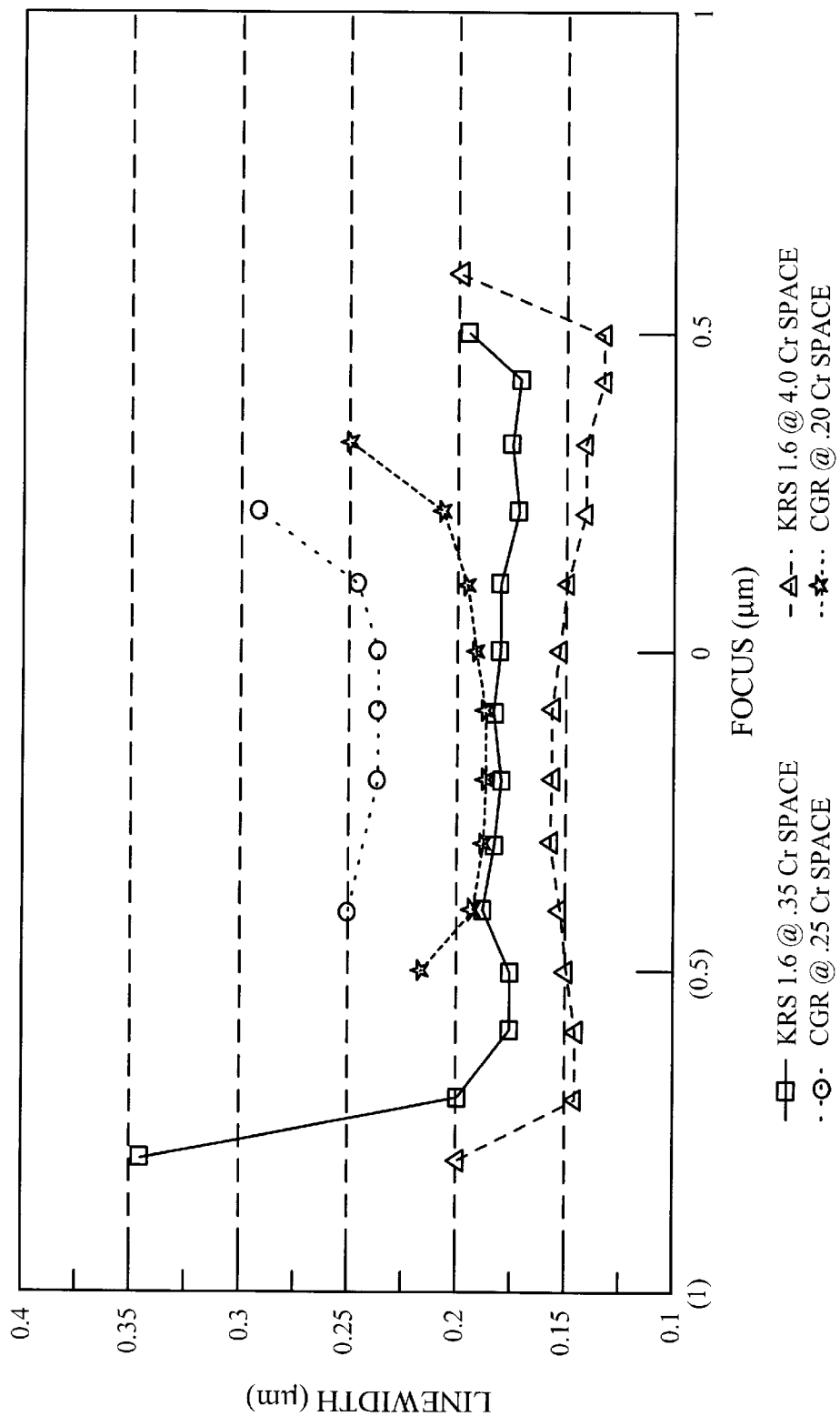
FIG. 11 is a comparative model of what the range of focus is for a given linewidth using standard resist formulations and a hybrid resist formulation of the present invention.

For example, we have found that with exposure on a DUV 0.5 NA lithography tool, the isofocal print bias for a hybrid resist can be 0.11 $\mu$m larger than the isofocal print bias for a standard negative tone resist, as exemplified in FIGS. 8 and 9 when standard calculations known in the art are performed on the data. This difference can be utilized in two ways. In one approach, the same reticle image size could be used with the hybrid resist to print a smaller line than the standard resist, while maintaining focus and exposure process latitude. In another manner of use, the size of the reticle features could be increased with the hybrid resist relative to the standard resist, while printing the same image size as the standard resist. The use of a larger reticle image provides a larger depth of focus due to reduced diffraction effects, as shown in the graph of FIG. 11. In the former application, higher performance is achieved with the smaller size of the hybrid resist. In the latter application, higher yield is achieved due to the larger process latitude of the hybrid resist.

The resist formulations may be varied to obtain a high photospeed positive tone reaction and a low photospeed negative tone reaction for optimal results. Additionally, the positive tone resist may be chosen so that it is insensitive to post expose bake (PEB) conditions so that the ratio of sensitivity of the positive tone to the negative tone function can be altered, thus changing the ratios of the space/line/space combinations.

Another option for changing the space/line/space ratios is to utilize a gray-scale filter in the reticle of the exposure tool. A gray scale filter only allows a portion of the radiation to pass through the reticle, thereby creating areas of intermediate exposure. This prevents the negative tone resist function from operating in these areas because the exposure dose would never reach the critical point, but would still allow the positive functions to occur, thereby creating wider spaces. This allows wider spaces to be printed at the same time as the narrower features, which is necessary in some device applications.

The following examples are exemplary of the frequency doubling resist composition, but are not meant to be limiting and many variations will be readily apparent to one of ordinary skill in the art.

The photoresist resins suitable for use in accordance with the invention include any of the base-soluble, long chain polymers suitable for use as a polymer resin in a photoresist formulation. Specific examples include: (i) aromatic polymers having an —OH group, e.g., polyhydroxystyrenes such as poly (4-hydroxystyrene), poly (3-hydroxystyrene), commercially available from Hoechst Celanese of Corpus Christi; Tex., novolak resins commercially available from Shipley of Marlboro, Mass.; and polymers having a phenolic —OH group, e.g., phenol formaldehyde resins; (ii) polymers having an acid group, e.g., polymethacrylic acid with an ester side chain; and (iii) acrylamide group type polymers.

The polymer resin in its deprotected form (i.e., once the positive tone reaction has occurred) is base soluble and compatible with developer solutions, such as aqueous solutions of metal-free ammonium hydroxide, tetramethylammonium hydroxide, and tetraethyl ammonium hydroxide, metal containing potassium hydroxide, and sodium metasilicate. Preferred polymer resins have an average molecular weight within the range of about 1,000 daltons to about 250,000 daltons, and most preferably within the range of about 1,000 to 25,000 daltons, to enhance its solubility in developer solutions. Examples include p-hydroxystyrene-maleic acid anhydiride copolymers, polyhydroxystyrene-p-tertiarybutyl-carganatostyrene co-polymers, poly(2-hydroxystyrene), phenol-formaldehyde resins, polymethyl methacrylate- tertiary butyl methacrylate-polymethacrylic acid terpolymers, poly-4-hydroxystyrene-tertiary butyl methacrylate copolymers, poly(4-hydroxystyrene) with one or more acid labile alkyl or aryl substituents on the aromatic ring, a poly(3-hydroxystyrene) with one or more allyl or aryl substituents on the aromatic ring, or any of these as the major number of subunits in a copolymer, such as PHM-C, commercially available from Maruzen America of New York, N.Y. The PHM-C includes both poly (hydroxystyrene) subunits and vinyl cyclohexanol subunits preferably being in the range of about 99:1 to about 50:50. The most preferred ratio is about 90 poly (hydroxystyrene) units to about 10 vinyl cyclohexanol subunits.

Crosslinking compositions are preferably tetramethoxymethyl glycouril ("Powderlink") and 2,6-bis(hydroxymethyl)-p-cresol. However, other possible crosslinking compositions include:

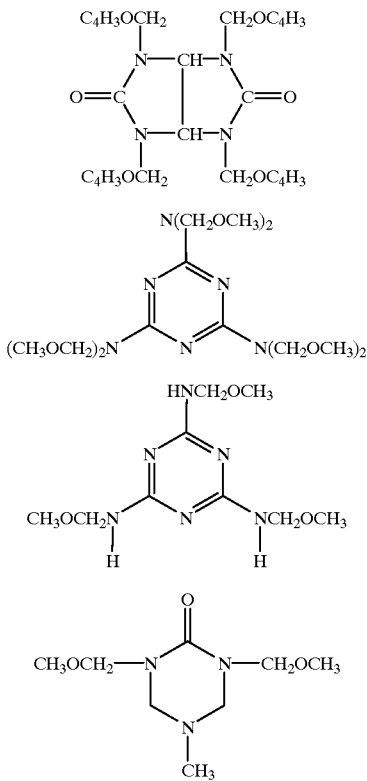

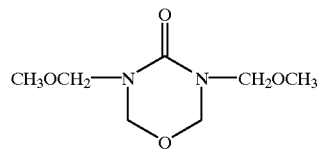

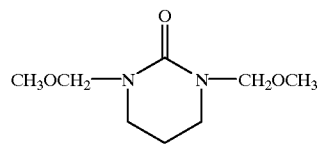

their analogs and derivatives, as can be found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycol-urils, for example of the formula:

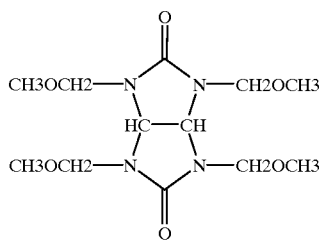

as can be found in Canadian Patent No. 1 204 547.

Photoacid generators ("PAG") include, but are not limited to: N-(trifluoromethylsulfonyloxy)-bicyclo[2.2.1]hept-5-ene-2,3-dicarboximide ("MDT"), onium salts, aromatic diazonium salts, sulfonium salts, diaryliodonium salts and sulfonic acid esters of N-hydroxyamides or -imides, as disclosed in U.S. Pat. No. 4,731,605, incorporated herein by reference. Also, a PAG that produces a weaker acid such as dodecane sulfonate of N-hydroxy-naphthalimide ("DDSN") may be used.

Possible base additives include, but are not limited to: dimethylamino pyridine, 7-diethylamino-4-methyl coumarin ("Coumarin I"), tertiary amines, proton sponge, berberine, and the polymeric amines as in the "Pluronic" or "Tetronic" series from BASF. Additionally, tetra alkyl ammonium hydroxides or cetyltrimethyl ammonium hydroxide, may be used when the PAG is an onium salt.

Examples of sensitizers that may be utilized include: chrysenes, pyrenes, fluoranthenes, anthrones, benzophenones, thioxanthones, and anthracenes, such as 9-anthracene methanol (9-AM). Additional anthracene derivative sensitizers are disclosed in U.S. Pat. No. 4,371,605, which is incorporated herein by reference. The sensitizer may include oxygen or sulfur. The preferred sensitizers will be nitrogen free, because the presence of nitrogen, e.g., an amine or phenothiazine group, tends to sequester the free acid generated during the exposure process and the formulation will lose photosensitivity.

A casting solvent is used to provide proper consistency to the entire composition so that it may be applied to the substrate surface without the layer being too thick or too thin. Sample casting solvents include: ethoxyethylpropionate ("EEP"), a combination of EEP and γ-butyrolactone ("GBL"), and propyleneglycolmonoethylether acetate (PM acetate).

In the following Examples, one of each of these has been chosen, however, it is to be recognized that many other compositions may be selected for various portions of the resist. In the broadest sense, the method and structure of the preferred embodiment may be achieved using any hybrid resist comprised of a negative tone component and a positive tone component, wherein the positive tone component acts at a first actinic energy level and the negative tone component acts at a second actinic energy level, the first and second actinic energy levels being separated by an intermediate range of actinic energy levels.

EXAMPLE 1

The following compositions were dissolved in propyleneglycol monomethylether acetate (PM acetate) solvent available from Pacific Pac, Inc., Hollister, Calif. containing 350 ppm of FC430, a non-ionic fluorinated alkyl ester surfactant available from 3M, St. Paul, Minn. for a total of 20% solids:

poly(hydroxystyrene) (PHS), 10% hydrogenated, available from Maruzen America, New York, N.Y. with about 25% of the phenol groups protected with methoxypropene (MOP), 81.2% of solids;

N-(trifluoromethylsulfonyloxy)-bicyclo-[2.2.1]-hept-5-ene-2,3-dicarboximide (MDT), available from Daychem Labs, Centerville, Ohio, 10.5% of solids;

tetramethoxymethyl glycouril (Powderlink), available from Cytec, Danbury, Conn., 8.2% of solids; and 7-diethylamino-4-methyl coumarin dye (Coumarin 1), available from the Aldrich Chemical Company, 0.1% of solids. The solution was filtered through a 0.2 $\mu$m filter. The solution was coated onto silicon wafers primed with hexamethyl-disilaaane with a soft bake of 110° Celsius (C) resulting in films of about 0.8 $\mu$m thick as determined by a Nanospec reflectance spectrophotometer. The coated wafers were then exposed with deep ultraviolet (DUV) excimer laser radiation having a wavelength of 248 nm in a 0.37 numerical aperture (NA) Canon stepper with a matrix of different doses from low doses to high doses and post expose baked (PEB) at 110° C. for 90 sec. The dissolution rates of the exposed films were calculated from the thickness of remaining film after developing for a given amount of time with 0.14 Normal (N) tetramethylammonium hydroxide (TMAH) developer. The dissolution rate vs. exposure dose relationship is shown in FIG. 6. As shown in FIG. 6, the resist has a very low dissolution rate (about 2 nm/sec) when unexposed. As the dose is increased, the dissolution rate increases until reaching about 50 nm/sec. The dissolution rate remains relatively constant at this level in the dose range of about 1 millijoule (mJ) to about 3 mJ. Increasing the dose further, the negative cross-linking chemistry becomes predominant and the dissolution rate falls back to a value close to zero.

Figure 13:
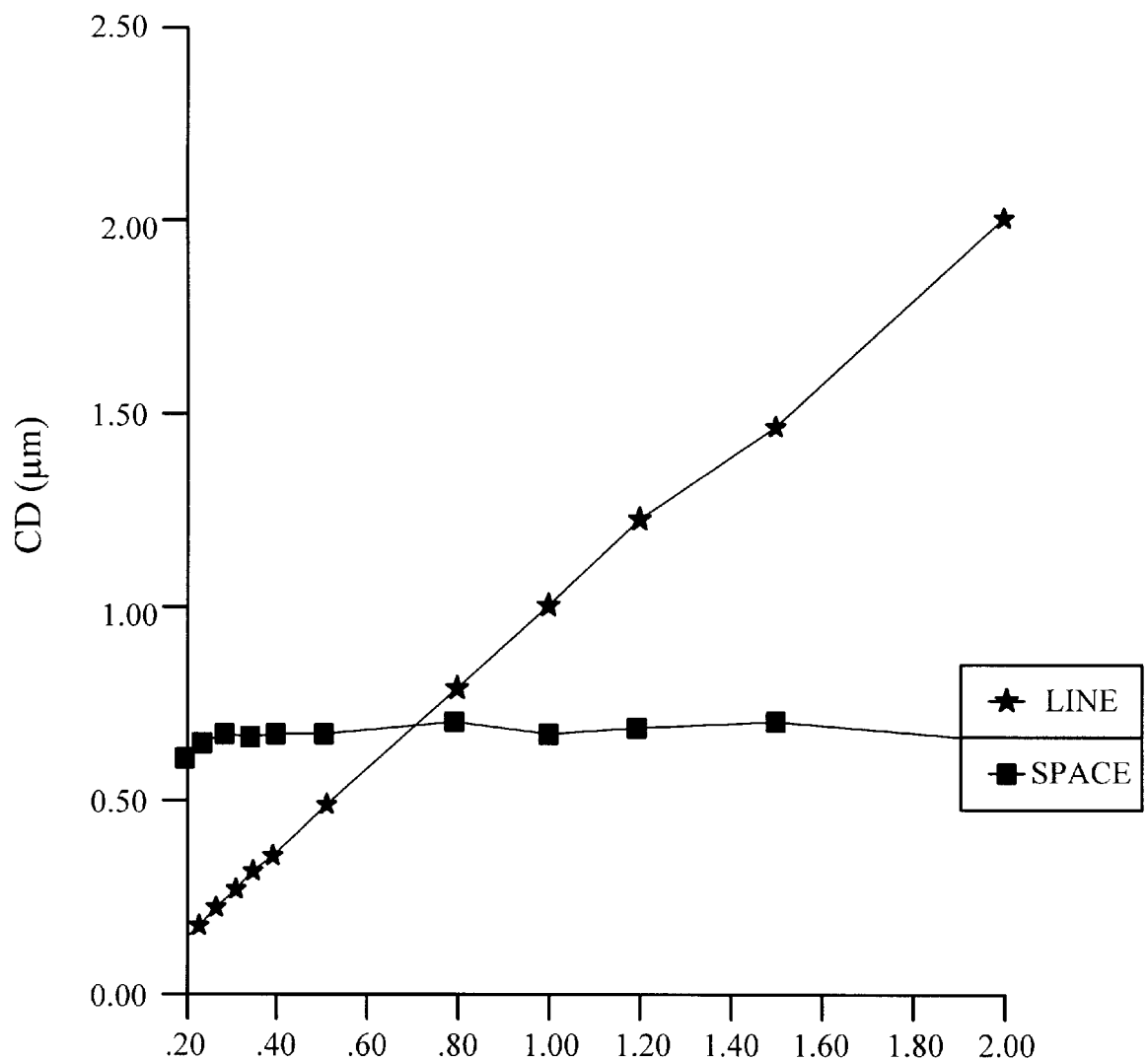
FIG. 13 is a graph showing the resultant line width and constant space width as functions of the chrome space width using one formulation of a hybrid resist of the present invention.

In another experiment with the same resist, when a MICRASCAN II 0.5NA DUV stepper is used to expose an isolated chrome space onto the hybrid resist film, the space/line/space measurements as a function of width of the chrome space are plotted, as shown in FIG. 13. The data suggests that, although the width of the line increases correspondingly with that of the chrome space on the mask, the space on either side of the line remains relatively constant.

EXAMPLE 2

This example illustrates the manner in which changing the type of photoacid generator and relative amounts of the various components can change the dissolution rate characteristics of the hybrid resist and subsequently the lithographic response. This second formulation was prepared and processed in a manner similar to EXAMPLE 1, however, it is comprised of the following components:

PHS with about 25% of the phenol groups protected with MOP, 90.8% of solids;
triphenyl sulfonium triflate, 1.3% of solids;
Powderlink, 7.8% of solids;
tetrabutyl ammonium hydroxide base, 0.1% of solids; and
sufficient PM acetate containing 350 ppm FC-430 surfactant as a solvent to form a 18.9% solids solution.

Figure 12:
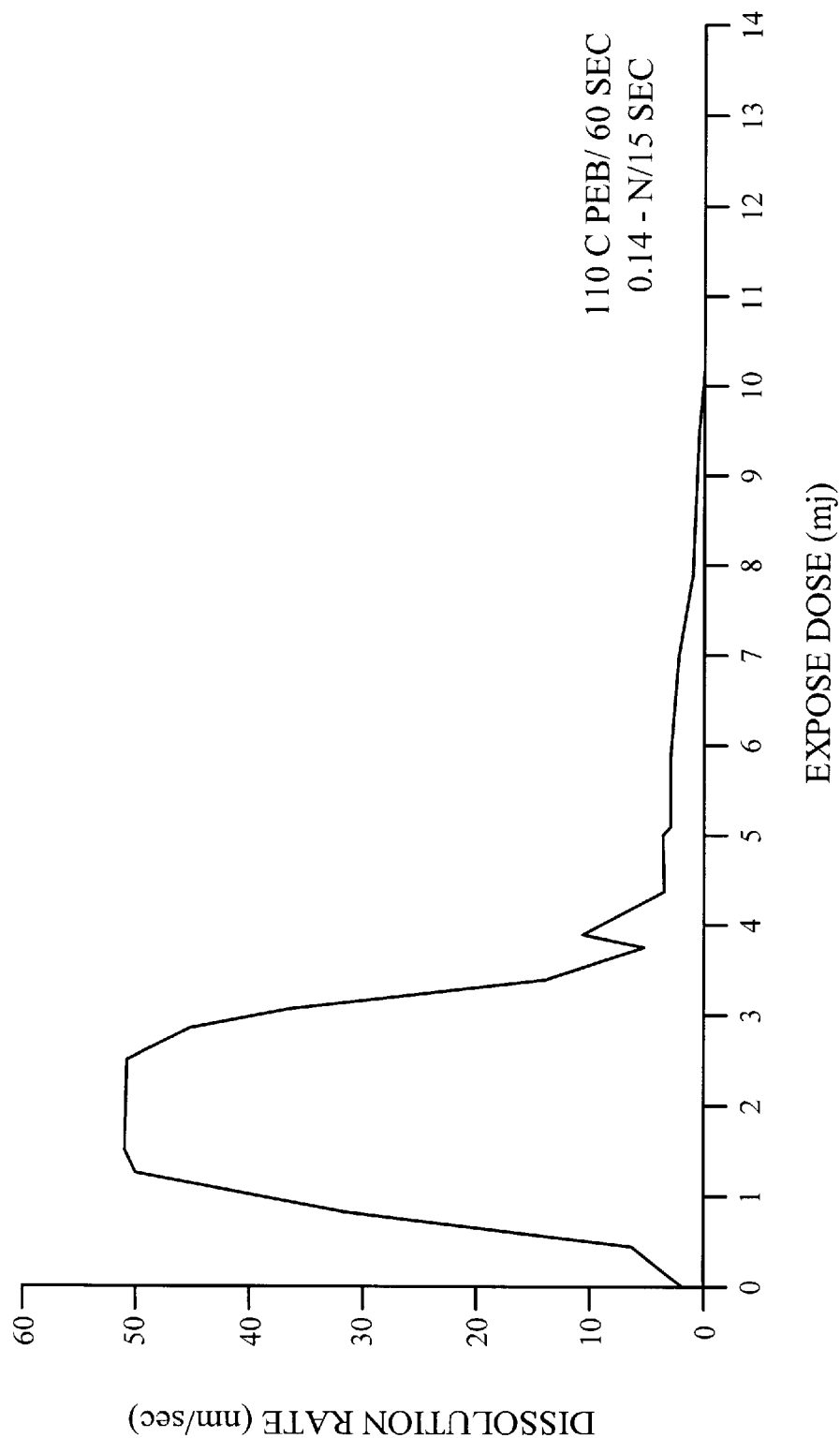
FIG. 12 is a graph showing the dissolution rate in nanometers per second (nm/sec) as a function of the exposure dose in millijoules (mJ) using one formulation of a hybrid resist of the present invention.
Figure 14:
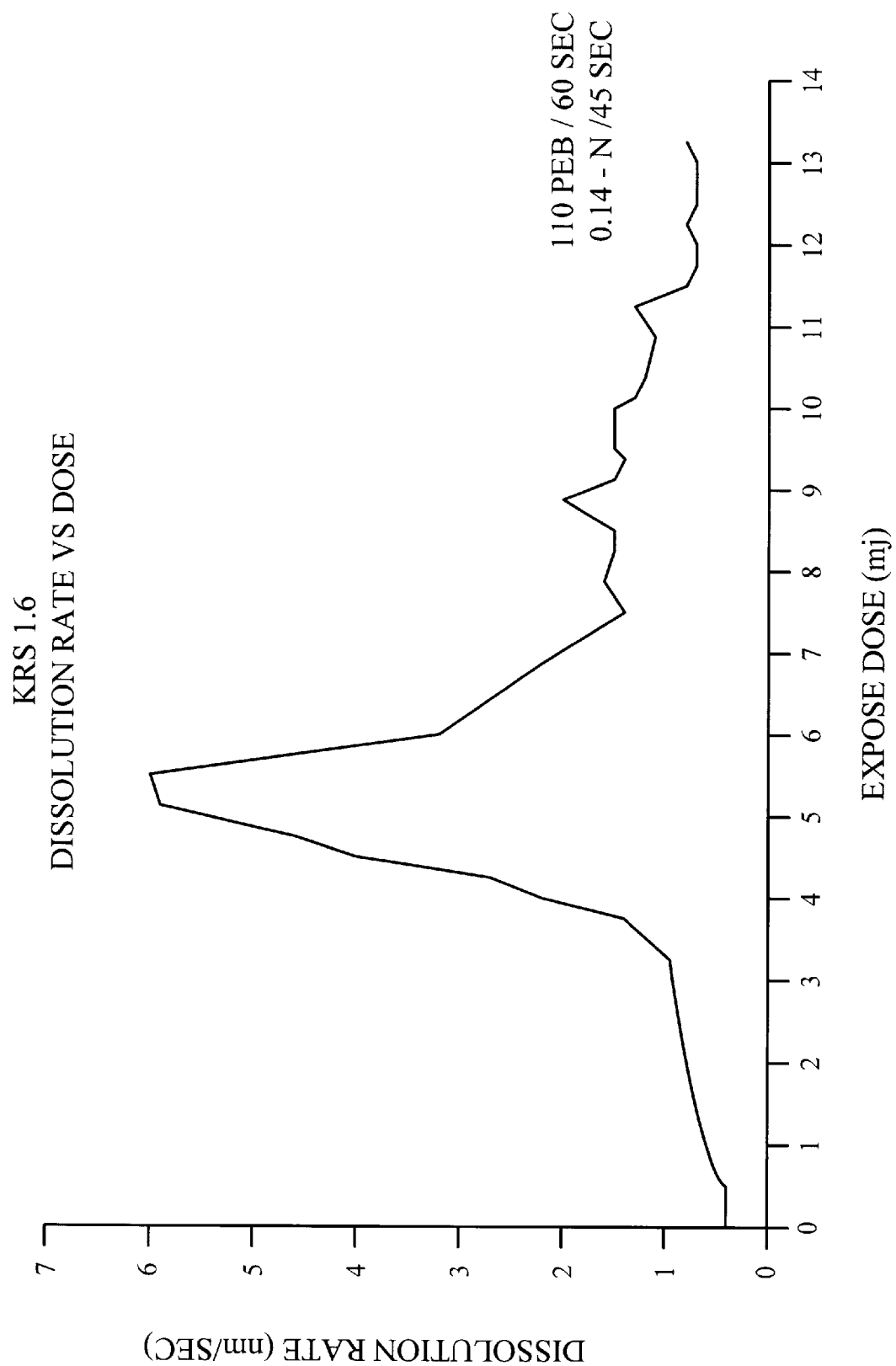
FIG. 14 is a graph showing the dissolution rate of an alternative formulation of the hybrid resist in nm/sec as a function of the exposure dose in mJ.

The dissolution rate characteristic of the resulting hybrid resist is shown in FIG. 14. The overall nature of the curve remains similar to that shown by the hybrid resist of EXAMPLE 1, in that the dissolution rate starts out low for an unexposed resist, increases to a high at about 5 mJ and decreases to a low above 7 mJ. However, the absolute dose range and the dissolution rates within these ranges are quite different from those shown in FIG. 12.

FIG. 16 represents the response of this formulation of the hybrid resist when exposed through a mask of nested chrome lines and spaces of equal widths in a MICRASCAN II DUV 0.5 NA stepper tool. Negative line, unexposed (positive) line and space widths are plotted as a function of exposure dose. The space remains relatively constant in the range of about 0.18 $\mu$m, whereas both lines vary as the exposure dose is varied.

EXAMPLE 3

This example illustrates that the space width of the frequency doubled image can be changed by varying the protection level of PHS with MOP. Two different PHS lots having 24% and 15% MOP loading, respectively, were used to make hybrid formulations identical to that of EXAMPLE 1, except that the total solids contents were adjusted to 16.0% of the total to obtain film thicknesses of about 0.5 $\mu$m. From these two stock formulations, several other formulations with average MOP levels ranging from 15 to 24% were prepared. Wafers were coated and soft baked at 110° C., exposed on a MICRASCAN II DUV 0.5 NA stepper, post exposed baked at 110° C. for 60 sec and finally developed with 0.14N TMAH developer. A reticle with an isolated chrome opening was printed in a hybrid resist film. The spacewidth of the resist image was measured and graphed as a function of the average MOP solubility inhibitor loading in the PHS used for making the respective formulations. It was found that the space width was strongly dependent on MOP concentration, as shown in FIG. 15.

EXAMPLE 4

Negative tone imaging may be performed with the hybrid resist of the present invention, using a blanket DUV expose after the PEB and prior to the develop.

A hybrid resist formulation as described in EXAMPLE 2, above, was image-wise exposed with a chrome reticle with an electrical test pattern on a 0.5NA DUV expose system. Silicon wafers (200 mm) with a 2000 Angstrom (Å) film of polysilicon were used as a substrate so that the resulting etched patterns of the resist image could be measured with electrical probe techniques. After the post expose bake process, the wafers were cycled back into the expose tool (MICRASCAN II) and exposed at 10 mJ per square centimeter (cm$^2$) with a clear glass reticle. A post expose bake process was not performed after the second exposure. The purpose of the second exposure was to remove the initially unexposed resist from the wafer, leaving only a negative tone resist pattern after develop.

The initial image-wise expose dose was 17–24 mJ/cm2, the post expose bake temperature was 110° C. for 90 sec and the develop time was 100 sec in 0.14N TMAH. A standard negative tone resist was processed in a similar fashion, with the omission of a blanket expose step as a control. The electrical data from this experiment is shown in FIGS. 8 and 9. A large isofocal print bias of approximately 0.11 $\mu$m was observed for the hybrid resist relative to the standard negative resist, as calculated using standard methods known in the art.

Figure 19:
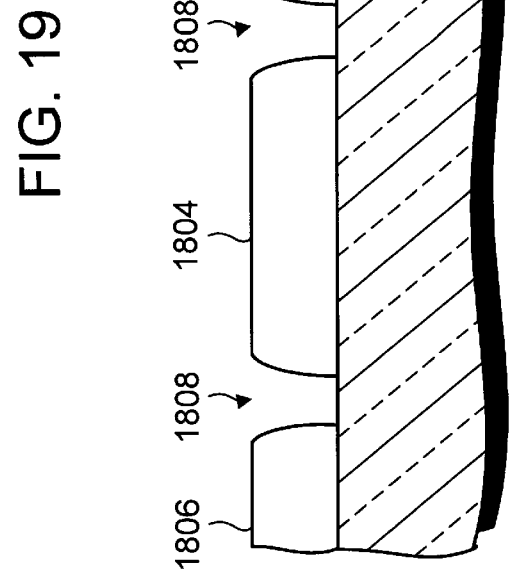
FIG. 19 is a cross-sectional side view of the wafer portion of FIG. 18 taken along line 19—19.
Figure 20:
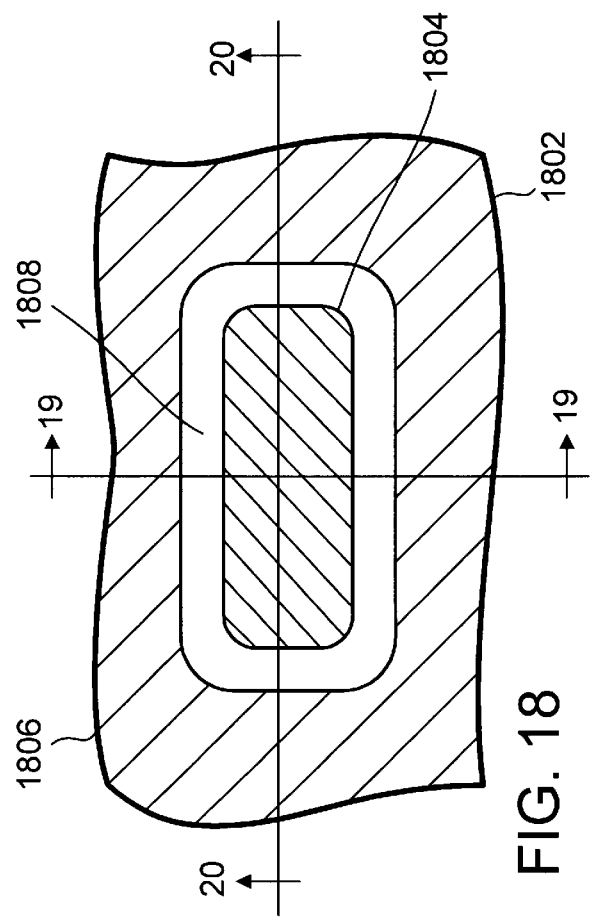
FIG. 20 is a cross-sectional side view of the wafer portion of FIG. 18 taken along line 20—20.
Figure 17:
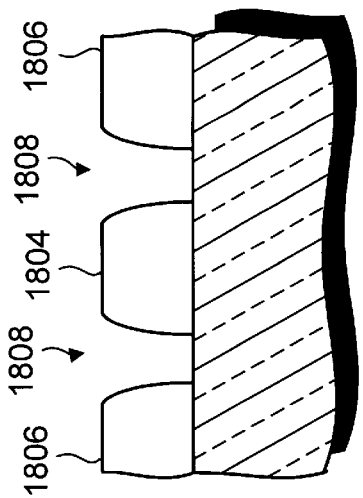
FIG. 17 is a schematic view of an exemplary mask portion.

When hybrid resist is exposed to actinic energy, areas of the resist which are subject to a fall exposure form a negative tone line pattern, areas which are unexposed form a positive tone pattern, and areas which are exposed to intermediate amounts of radiation become soluble and wash away during development. Turning to FIG. 17, an exemplary mask 1700 containing a mask blocking shape 1702 is illustrated. When hybrid resist is deposited on a wafer, exposed through mask 1700 with actinic radiation, and developed, the mask 1700 creates the a "linked" or "donut" pattern in the hybrid resist. Such a linked pattern is illustrated FIGS. 18, 19 and 20, where FIG. 19 is a cross section of the wafer in FIG. 18 taken along lines 19—19, and FIG. 20 is a cross section of the wafer in FIG. 18 taken along lines 20—20.

Figure 18:
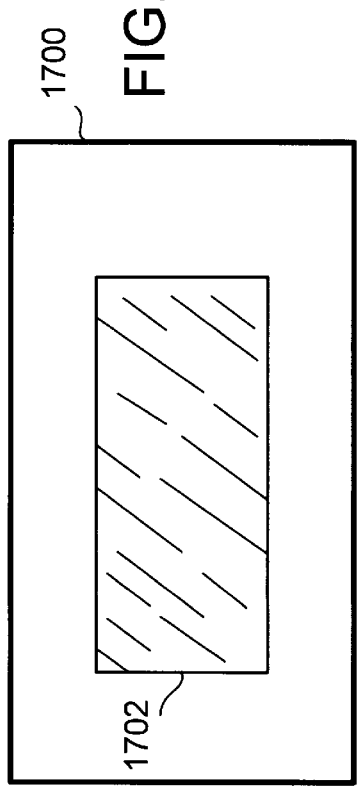
FIG. 18 is a top schematic view of a wafer portion with patterned hybrid resist upon it.

FIG. 18 shows a wafer portion 1802 upon which hybrid resist has been deposited, exposed through mask 1700 containing a blocking shape 1702 and developed. Hybrid resist portions which are unexposed (ie., the inside region 1804 blocked by mask shape 1702) remain photoactive and insoluble in the developer and form positive tone line patterns. Hybrid resist portions which are exposed with high intensity radiation (i.e., the outside region 1806 not blocked by mask shape 1702) are completely cross-linked during the post exposure bake and form a negative tone line pattern. Hybrid resist portions which are exposed with intermediate amounts of intensity (i.e., the areas under the edges of mask shape 1702) become soluble in developer solution after the first exposure and are dissolved during the development step and form space 1808 in the hybrid resist.

Because portions of the hybrid resist were unexposed during the first exposure, these regions remain photoactive and now comprise positive tone resist patterns. Thus, by blanket exposing the wafer these positive tone resist patterns are polymerized and can be washed away during development. The blanket exposure is preferably an intermediate exposure, either by exposing at a low enough dose or for a short enough time to create an intermediate response to those areas of resist that were unexposed (i.e, the positive tone patterns) in the first exposure step.

In the alternative, the positive tone portions can be removed by a selective etch using a solution of pure n-butyl acetate at room temperature or with a strong base, such as 0.35 Normal ("N") tetramethyl ammonium hydroxide ("TMAH").

Figure 22:
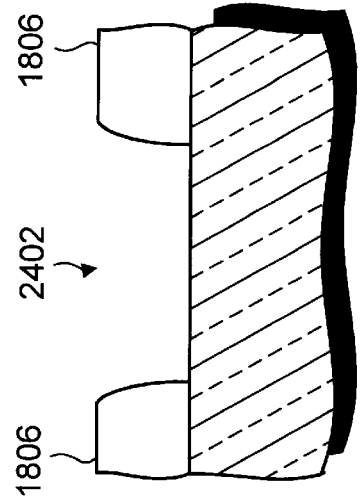
FIG. 22 is a cross-sectional side view of the wafer portion of FIG. 21 taken along line 22—22.
Figure 23:
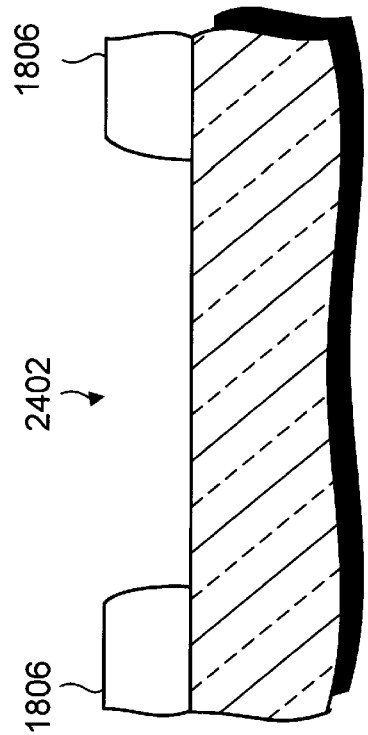
FIG. 23 is a cross-sectional side view of the wafer portion of FIG. 21 taken along line 23—23.
Figure 21:
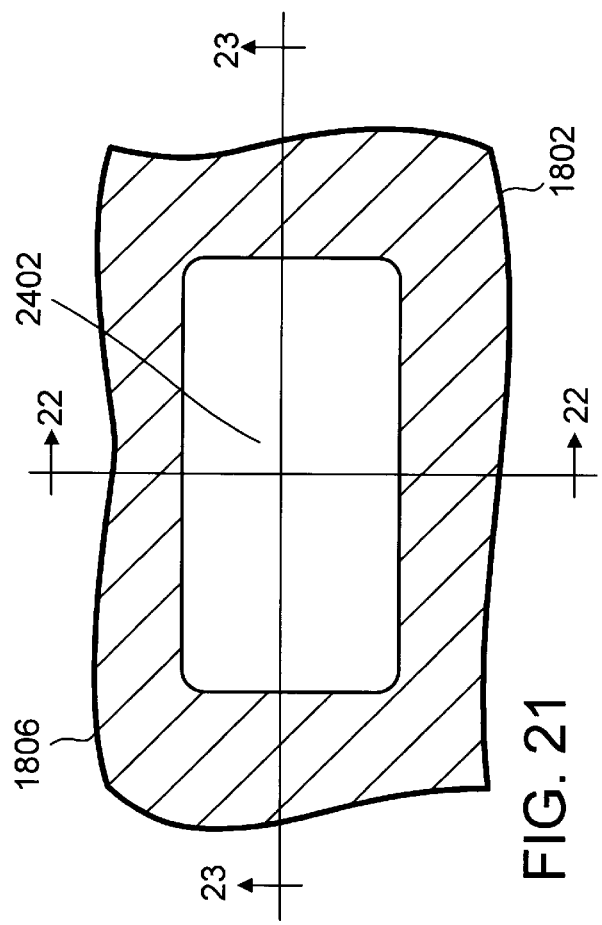
FIG. 21 is a top schematic view of a wafer portion with patterned hybrid resist and positive tone portions removed.

Turning to FIGS. 21, 22, and 23, the wafer portion 1802 is illustrated after a blanket exposure and development, where FIG. 22 is a cross section of the wafer portion in FIG. 21 taken along lines 22—22, and FIG. 23 is a cross section of the wafer taken along lines 23—23.

The blanket exposure has caused the positive tone regions (i.e., the hybrid resist portion 1804 (of FIGS. 18, 19 and 20)) which were unexposed (ie., blocked by mask shape 1702) to become soluble and wash away during development.

Preferred embodiments

The preferred embodiments of the present invention capitalize on the unique properties of x-ray lithography to optimize the use of hybrid resist. In particular, the invention provides a method to produce high tolerance devices with x-ray pitch and a means to vary the space width and to fine tune to account for process variations. Because of the nature of the hybrid resist discussed above, a space formed in a hybrid resist corresponds to the transition from light to dark at the edge of an aerial image. That is, the portion of the resist exposed to some predetermined range of intermediate radiation intensity (less than full intensity but more than zero intensity) will develop away to become a space. Accordingly, the size of the space is a function of the sharpness of the aerial image. Where an aerial image has a high contrast, the distance over which the transition from full intensity to zero intensity occurs may be relatively small. Also, where an aerial image has a low contrast, the distance over which the transition occurs will be larger and the developed space correspondingly larger. The present invention method uses adjustments in the mask-wafer gap during x-ray exposure to form spaces in hybrid resist of a desirable dimension. Accordingly, a predetermined space width in the hybrid resist can be selectively printed by varying the gap, allowing more versatile structures to be formed and adjustments to be made for process changes such as resist composition and ion implant levels.

Because a space in a hybrid resist will develop away when exposed to an intermediate level of actinic energy, the contrast of the aerial image is the key to space width in x-ray lithography as well optical lithography. Image contrast determines the width of the region on a resist that receives intermediate exposure at the edge of an aerial image projected onto the resist. However, contrast of the aerial image is generally independent of exposure dose and mask image size in the range of interest. Since the area of intermediate exposure defines the space width developed in a hybrid resist, the space width is also independent of exposure dose and mask image size. Even so, the location of a space is defined by the location of the edge of a mask image and the width of the space may also be affected by resist formulation. For these reasons, abnormalities in a x-ray mask, such as variations in the mask shape, will not cause abnormalities in the area of intermediate exposure nor the corresponding space width.

For example, if a 50 nm space is desired in a positive resist, then, generally speaking, the mask for the positive resist will have a corresponding 50 nm image. An abnormality can easily occur in the mask produced by EBL such that the image is only 35 nm in one region of the image. After fabricating a device using the 35 nm space, a device defect may result since the device will be more narrow than the intended 50 nm. If using a hybrid resist, then the size of the space produced will remain constant and only its location will change slightly as defined by the image edge in the region where the image is too narrow. A slight location change is less likely to cause a device defect as compared to improper dimension. Thus, by using a hybrid resist in x-ray lithography according to a preferred embodiment of the present invention, the abnormalities or defects in the mask typically do not transfer as device defects to the semiconductor. Accordingly, the advantages of smaller wavelength x-rays may be realized as smaller devices on a semiconductor.

While independent of mask size, space width in a hybrid resist is very dependent on aerial image contrast because the transition from zero intensity to full intensity defines the width of the hybrid resist region that receives intermediate exposure. In x-ray lithography, because the mask image is proximity printed, aerial image contrast is determined by the gap distance between the resist layer and mask. Gap distances of 10–50 μm are typical and, in conventional processes, the smaller the gap the better since the image will generally have a higher contrast. Some caution must be exercised in varying gap width since diffraction effects can yield counterproductive phenomena such a Poisson's bright spot. Nevertheless, according to a preferred embodiment of the present invention, when hybrid resists are combined with x-ray lithography gap distance becomes a variable process parameter for determining space width. Depending on the resist formulation and other factors, the characteristics of an aerial image can be determined using complex modeling to achieve, within certain bounds, a desired space width in a hybrid resist.

EXAMPLE 5

This example illustrates the manner in which changing the type of solubility inhibitor on the resin can change the dissolution properties of a resist formulation to reduce resist loss in the dark areas of the x-ray pattern. A formulation was prepared in a manner similar to Example 1, however, it included the following components:
PHS with about 25% of the phenol groups protected with methoxy cyclohexene (MOCH), 89.7% of solids;
triphenyl sulfonium triflate, 2.5% of solids;
Powderlink, 7.8% of solids;
tetrabutylamnmonium hydroxide base, 0.1% of solids; and
sufficient PM acetate containing 350 ppm FC-430 surfactant as a solvent to form a 13% solids solution.

The solution was filtered through a 0.2 μm filter then coated onto silicon wafers primed with hexamethyldisilazane with a soft bake of 100° C. resulting in films of about 0.3 μm thick. The coated wafers were then exposed with x-ray radiation with a wavelength of approximately 8 Å on a Suss stepper. The mask-wafer gap setting was 40 μm and the expose dose values ranged from 150 to 250 mj/cm$^2$. The expose mask consisted of a gold or tantalum absorber about 0.5 μm thick, with a mask pattern dimension of 0.35 to 0.8 μm. After expose, the wafers were baked at 95° C. for 90 seconds and then developed in 0.14 N TMAH for 150 seconds. The resulting images provided a resist space width of about 60 nm.

Figure 24:
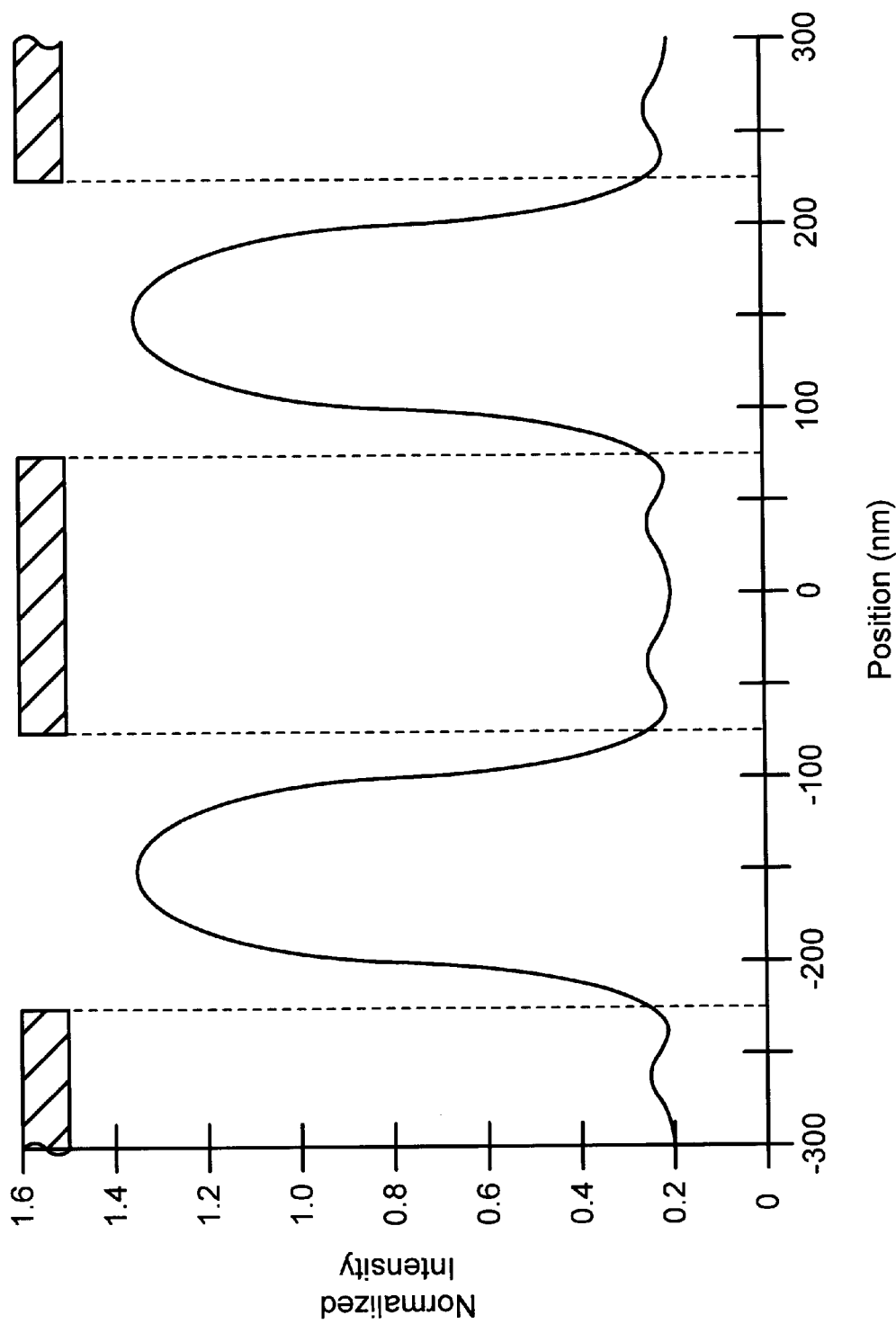
FIG. 24 is a graph of the energy intensity produced by an x-ray mask image of 150 nm equal lines and spaces at a 25 $\mu$m gap.
Figure 25:
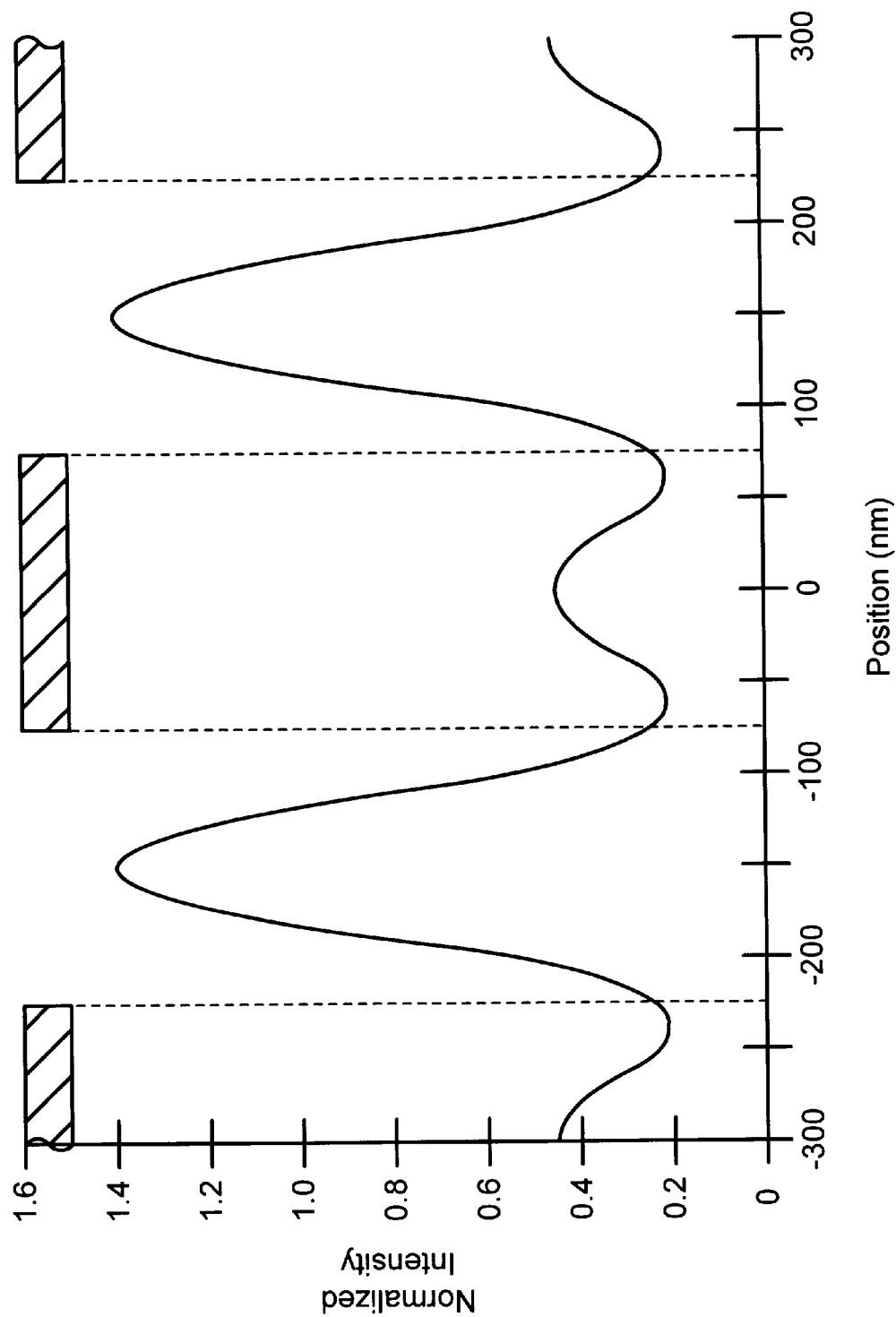
FIG. 25 is a graph of the energy intensity produced by an x-ray mask image of 150 nm equal lines and spaces at a 35 $\mu$m gap.
Figure 26:
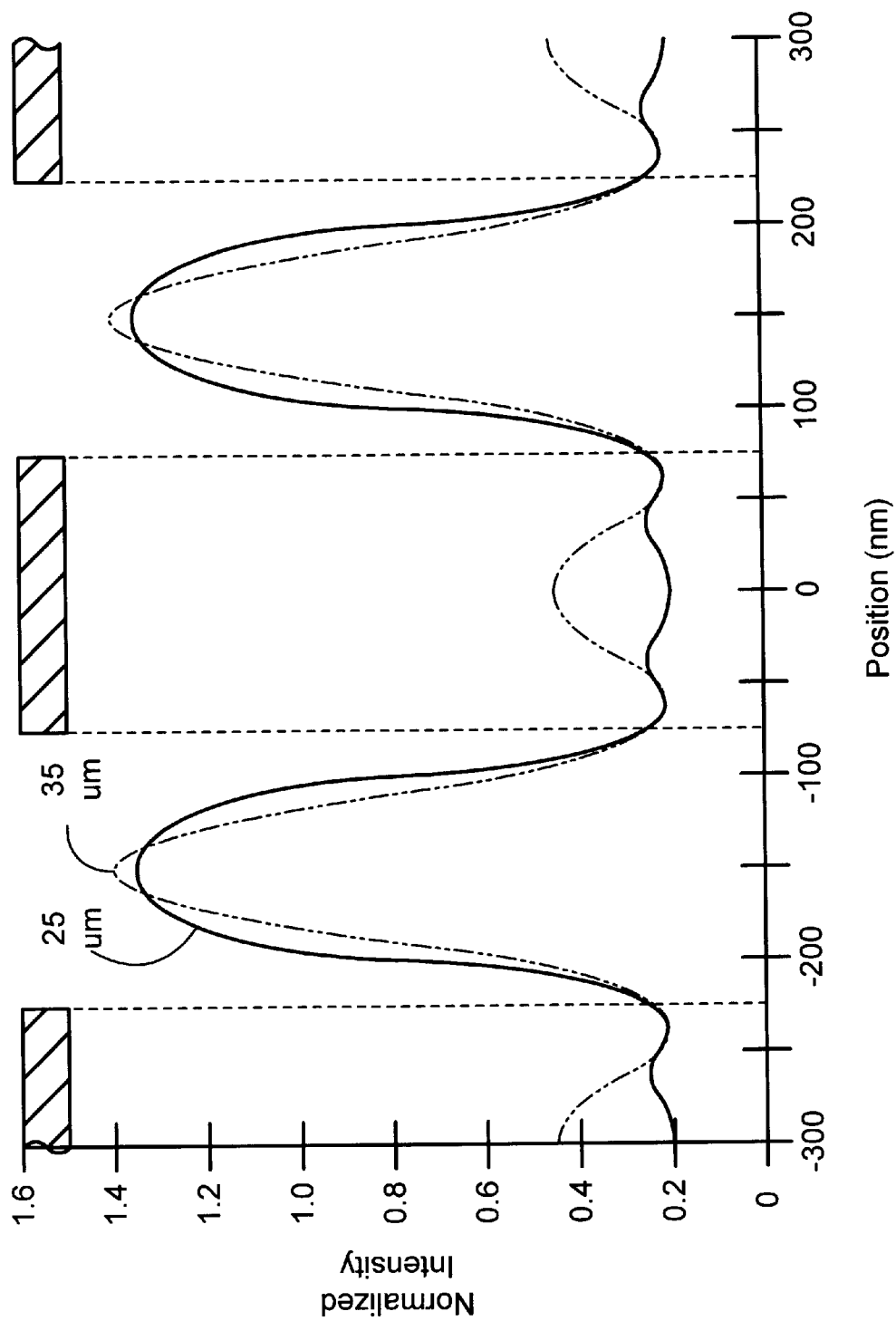
FIG. 26 is a graph superimposing the energy intensity curve of FIG. 24 onto the curve of FIG. 25.

FIGS. 24–26 show how a change in gap distance affects energy intensity as a function of position relative to the mask shape, which is related to contrast. FIG. 24 is a graph of the output from a conventional model used to describe the actinic energy that passes through a x-ray mask image. The model was used to estimate the energy intensity profile that would result from a mask of 150 nm equal lines and spaces, using a 420 nm thick layer of gold as the mask material and providing a 25 μm gap distance between the mask and resist. In FIG. 25, only the gap distance was changed and equals 35 μm. Both FIGS. 24 and 25 show that, due to diffraction and other effects, the full intensity of x-rays directed through the mask diminishes near the edge of a space in the mask. Also, the two figures indicate that a change in the intensity profile occurs as the gap distance changes. If the mask was juxtaposed against the resist layer with zero gap, then there would be very little, if any, diminishment of intensity at the space edge. However, as the mask-wafer gap distance increases, intensity at the edges begins to diminish or, in the other words, it lowers the aerial image contrast.

FIG. 26 provides a comparison of the intensity profile of FIG. 24 superimposed on the profile of FIG. 25. As indicated by FIG. 26, for a resist layer exposed through a mask 35 μm from the resist, a wider region will receive an intermediate level of energy than a resist exposed through a mask 25 μm from the resist. Noticeably, the 35 μm profile drops off from full intensity further from the space edge than the 25 μm profile. Accordingly, a greater portion of the resist receives a full intensity level from the 25 μm profile than from the 35 μm profile.

Figure 27:
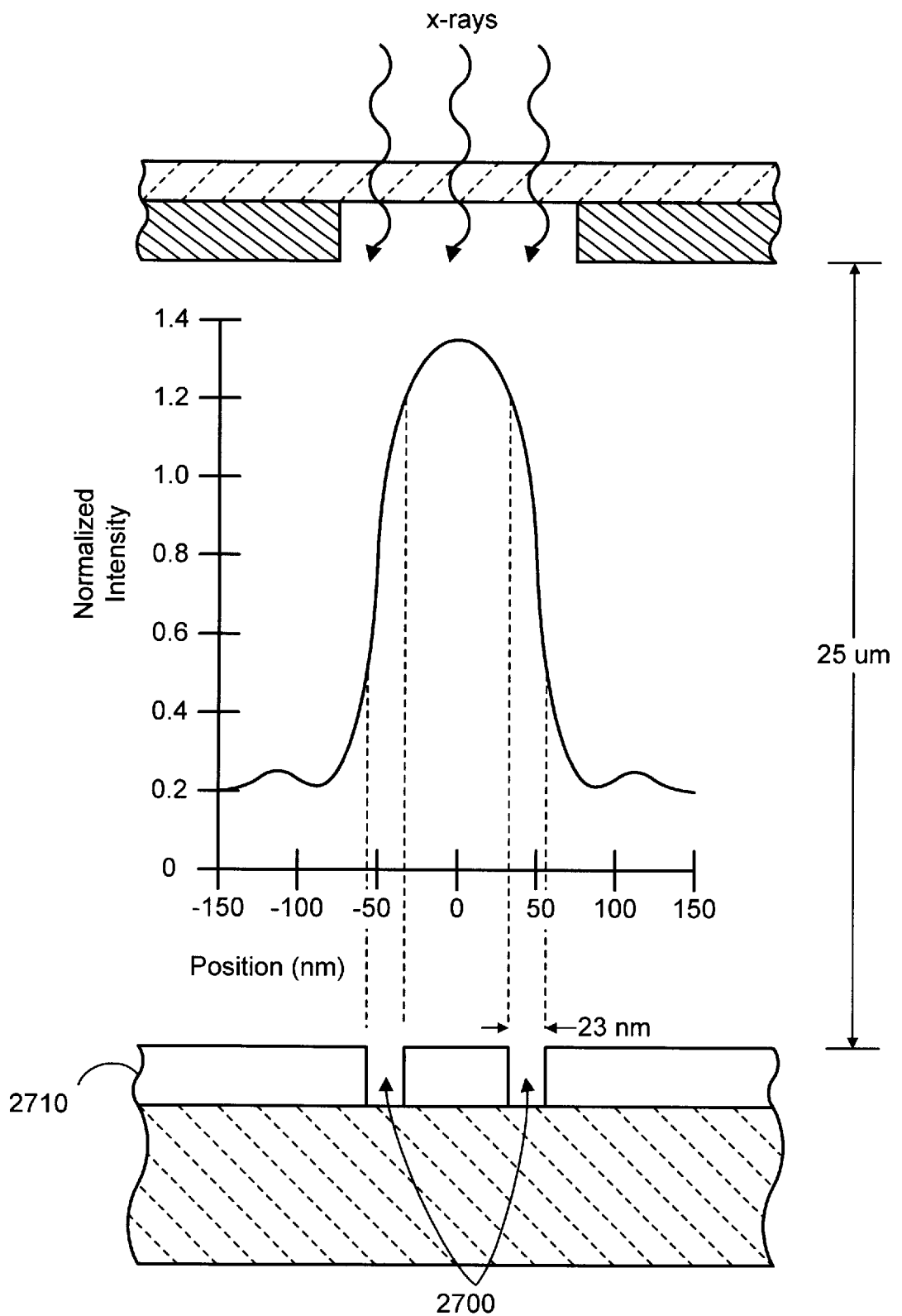
FIG. 27 is a diagram showing how the x-ray energy intensity curve at a 25 $\mu$m gap determines the width of spaces formed in a hybrid resist.
Figure 28:
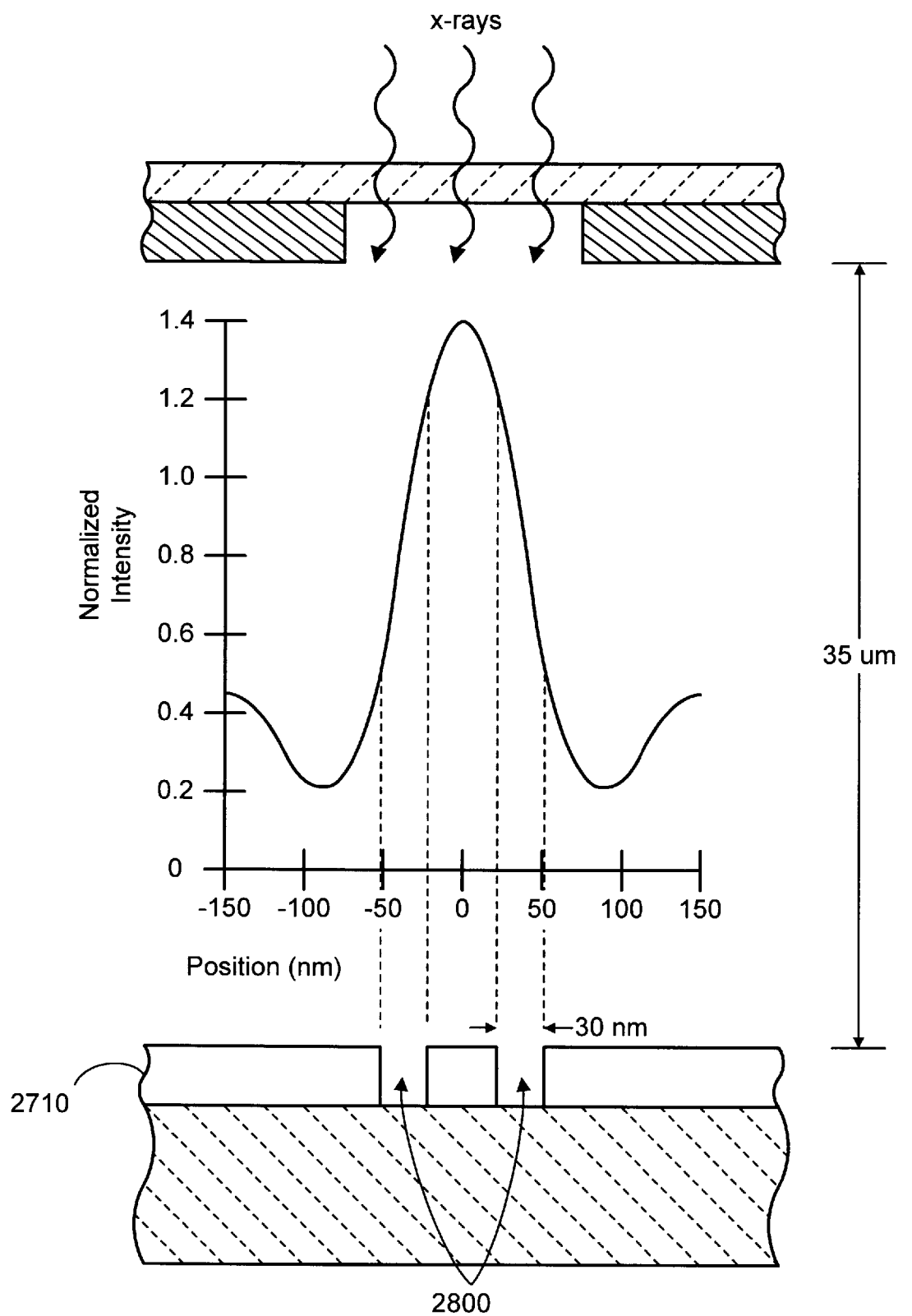
FIG. 28 is diagram showing how the x-ray energy intensity curve at a 35 $\mu$m gap determines an increased width of spaces formed in a hybrid resist.

The effect of the energy profile differences is shown in FIGS. 27 and 28. FIG. 27 includes the same energy profile as FIG. 24, corresponding to a gap distance of 25 μm. If a hybrid resist is selected that will exhibit a positive tone response to energy levels between 0.5 and 1.2, then two 23 nm spaces 2700 will develop in the hybrid resist 2710. The space width shown in FIG. 27 is designated solely to provide illustration of the principle involved in the present invention and not by way of limitation or expectation. Whether the specified space width will actually result in a hybrid resist exposed through a 150 nm mask will depend upon several other factors, for example, the resist formulation, the mask material, the wavelength produced from the x-ray source, and the developer solution(s).

FIG. 28 includes the same energy profile as FIG. 25, corresponding to a gap distance of 35 μm. As described above, if a hybrid resist is selected that will exhibit a positive tone response to energy levels between 0.5 and 1.2, then two spaces will develop in the hybrid resist. However, the spaces 2800 will be 30 nm in width due to the difference in the energy profile at a 35 μm gap. That is, more of the resist is exposed to a level of energy within the intermediate range because the aerial image has a lower contrast.

The ability to vary the space width in a hybrid resist has at least two primary applications. First, it can be used to increase the versatility of hybrid resist technology by forming spaces of varied width in a given resist. Second, it can be used to fine tune the process of forming resist spaces by accounting for variations in resist chemistry, ion implants, and other process conditions or steps.

As to the first primary application, for a given exposure wavelength in optical lithography, the numerical aperture (NA) determines the resolution or sharpness of the aerial image projected onto the resist and, thus, determines the size of the resulting space on a hybrid resist. The space width is generally unchanging as the exposure dose and the reticle image size are changed and is, instead, largely dependent on the chemical composition of the hybrid resist. This allows very precise image control for a set space width within each chip, across each wafer, and from one batch of product wafers to the next, provided the same resist is used. However, the NA is set on the step-and-repeat tool for exposure of a given resist layer and then not changed because of the difficulty and problems associated with changing NA. Since the NA is difficult to change and other variables that might determine space width are held constant, there is no means in optical lithography for varying the space width produced in a given hybrid resist layer deposited on a wafer. Once the NA is selected, the space width is set and varied space widths cannot be easily produced in the same resist layer. The versatility of hybrid resist technology may be increased in x-ray lithography with the method according to a preferred embodiment for varying the hybrid resist space width in a given resist layer.

As indicated above, hybrid resist portions that are unexposed (i.e., the regions blocked by a mask shape) remain photoactive and insoluble in developer. Accordingly, after a first exposure and development of spaces having a first width, the unexposed regions may be exposed through a second mask at a second mask-wafer gap distance to produce spaces having a second width. Alternatively, after a first exposure, but before development of the first spaces, the unexposed regions could be exposed through a second mask at a second gap distance. Caution must be exercised in producing the spaces having a second width to prevent areas previously exposed at an intermediate level from becoming overexposed during the second exposure. If an area intended to become a space is overexposed, then the negative tone chemistry will be activated and it will not later develop into a space. Accordingly, hybrid resist spaces of varying width are provided.

As to the second primary application, with typical resists, such as a conventional positive resist, a mechanism generally exists for fine tuning the process to account for variations and still yield a product within tolerances. For example, if the chemical composition of a new batch of positive resist material is slightly out of specification and will result in space dimensions different from that required, then adjustments can be made in exposure dose. For smaller than expected space dimensions in the conventional positive resist, the exposure dose is increased to more highly expose the image edges where diffraction previously limited the exposure. The increased exposure at the image edges will accordingly increase the space dimensions to the needed size. Similarly, it may be that an ion implant step is improperly performed in a transfer device such that the performance of the associated transistor will be affected. One conventional remedy used with typical resists is to increase the dimension of the space wherein the gate will be formed to yield a larger gate and to offset the ion implant error. Again, the space dimension can be varied simply by changing the exposure dose of the conventional positive resist.

As indicated above, the space dimension in a hybrid resist is independent of exposure so the previous methods for fine tuning to account for variations are not helpful with hybrid resists. The value of hybrid resist technology may be improved in x-ray lithography with the method according to a preferred embodiment for fine tuning the resist spaces by accounting for variations in resist chemistry, ion implants, and other process conditions or steps. For a given set of process conditions, an energy profile model can be used to predict the energy profile that will exist and, accordingly, to predict how space width will change as mask-wafer gap distance is changed. These predictions can be used to account for variance in process conditions. For example, if the chemical composition of a new batch of hybrid resist material is slightly out of specification and will result in space dimensions different from that required, then adjustments can be made in gap distance. For larger than expected space dimensions in the resist (i.e., not enough positive solubility inhibitor), the gap may be modified in accordance with a predictive model to increase the contrast of the aerial image and more highly expose the image edges where diffraction previously limited the exposure. Modeling a predicted contrast is required since the change in contrast as a function of mask-wafer gap is not a linear nor a monotonic response. However, an increased exposure at the image edges will accordingly decrease the space dimensions. Similarly, it may be that an ion implant step is improperly performed in a transfer device such that the performance of the associated transistor will be affected. Again, the space dimension can be varied by changing the gap distance.

Figure 29:
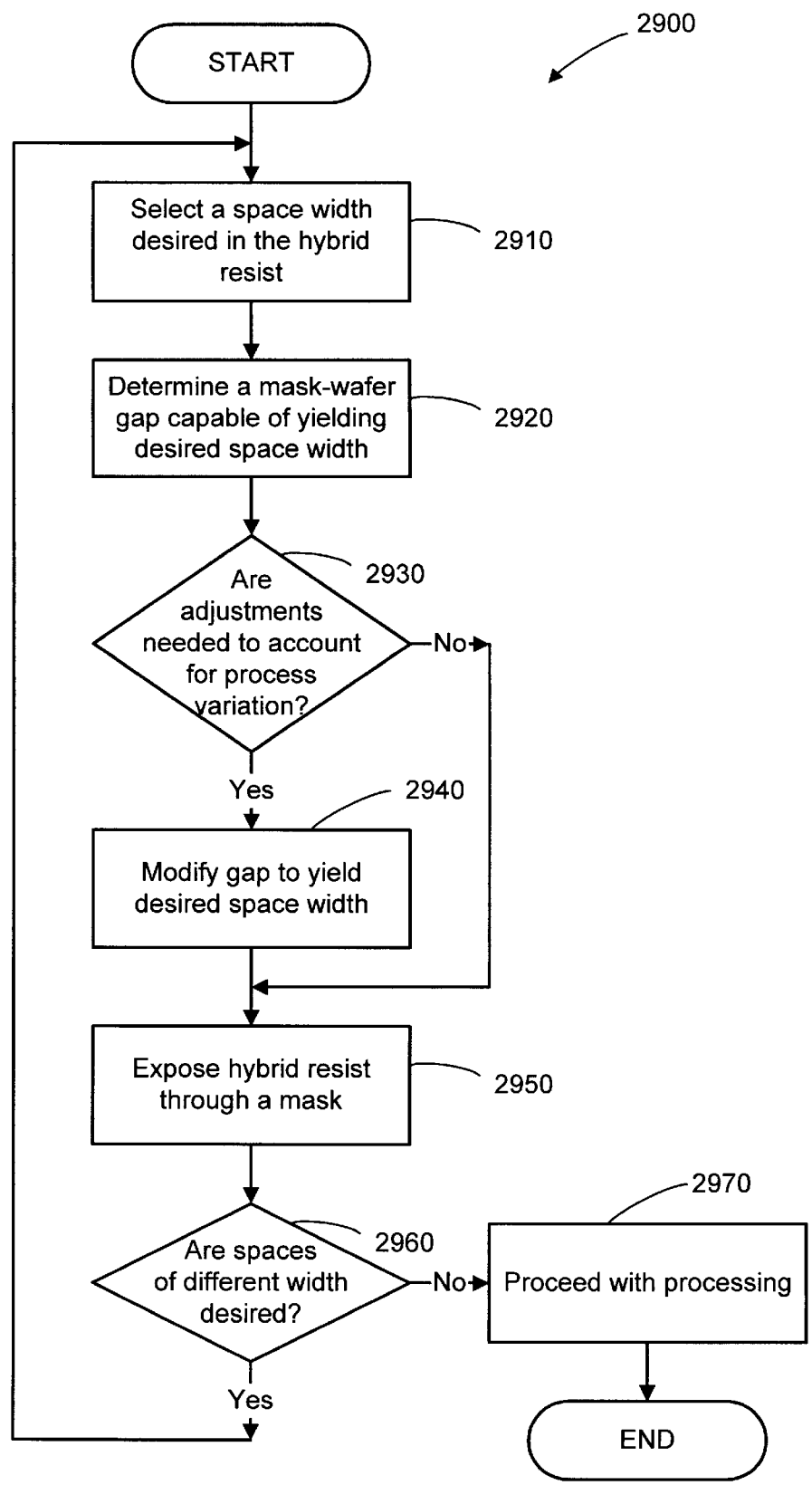
FIG. 29 is a flowchart showing a process for forming a hybrid resist space using x-ray lithography according to a preferred embodiment of the present invention.

As described in FIG. 29, the two primary applications for the ability to vary space width in a hybrid resist can be combined into one novel method. A method 2900 according to a preferred embodiment of the present invention is a significant modification to a part of the much more complex conventional process of fabricating integrated circuit devices. The new method begins with a step 2910 of selecting a space width desired in the hybrid resist. Once a space width is selected, a step 2920 is executed by determining a mask-wafer gap capable of yielding the desired space width. Preferably, such determination is made by using an energy profile model indicating an area of hybrid resist that will receive an intermediate level of x-ray radiation depending on the mask-wafer gap. FIGS. 24 to 28 offer examples of the type of output that an energy profile model may yield. The model could also be further manipulated to automatically yield a gap distance in $\mu$m rather than graphically plotting the profile and figuring the space width as exemplified by FIGS. 27 and 28. As such, the model may comprise a computer program capable of calculating mask-wafer gap after input of desired space width, diffraction effects, and other process variables that influence space width.

Process variables are also involved in a step 2930 of checking whether adjustments in mask-wafer gap are needed to account for variations in process variables. That is, resist formulation may change after performing the initial calculations wherein gap was determined or processing errors may occur, such as improper ion implantation, requiring modification of space width. If adjustment is needed, then the mask-wafer gap can be modified as in step 2940 according to the preferred embodiment to yield the desired space width. It may be, as in the case of resist formulation changes, that the desired space width is the width originally determined and gap modification will simply maintain the desired width. Alternatively, it may be, as in the case of improper ion implantation, that the desired space width is different from the originally determined width and gap modification will yield a change in space width.

Once a mask-wafer gap modification is made in step 2940 or determined to be unnecessary in step 2930, then the hybrid resist is exposed through a mask positioned at the established mask-wafer gap in step 2950. As discussed earlier, the result of the exposure will yield a resist having three different regions of exposure. The portions that are unexposed (i.e., the inside region 1804 of FIG. 18 blocked by mask shape 1702) remain photoactive and insoluble in developer and form positive tone line patterns. Portions that are exposed with high intensity radiation (i.e., the outside region 1806 not blocked by mask shape 1702 ) will form a negative tone line pattern. Finally, other portions receive intermediate amounts of intensity (i.e., the areas under the edges of mask shape 1702) and are soluble in developer solution after the first exposure.

After a first exposure, step 2960 allows the option of forming additional structures of different width than the space width originally selected in step 2910. Since a portion of the resist remains photoactive after step 2950, the photoactive portion can be subsequently exposed through a mask positioned at a different mask-wafer gap and, thus, yield a space having a correspondingly different space-width. Essentially, method 2900 allows for different space widths to be formed by re-executing steps 2910 to 2960 as long as photoactive portions of the resist remain. Care must be exercised in re-execution of the steps to avoid re-exposing areas that already received intermediate amounts of intensity, otherwise, such areas might not develop into resist spaces. If no additional exposures are necessary as determined in step 2960, then processing may proceed to complete the integrated circuit device as in step 2960.

While the invention has been particularly shown and described with reference to preferred embodiments thereof, it will be understood by those skilled in the art that various changes in form and details may be made therein without departing from the spirit and scope of the invention. Accordingly, unless otherwise specified, any dimensions of the apparatus indicated in the drawings or herein are given as an example of possible dimensions and not as a limitation. Similarly, unless otherwise specified, any sequence of steps of the method indicated in the drawings or herein are given as an example of a possible sequence and not as a limitation.

We claim:

1. A x-ray lithography method for forming spaces in a resist, the method comprising the steps of:
   a) selecting a first space width for a first hybrid resist space;
   b) determining a first mask-wafer gap capable of yielding the first space width;
   c) depositing a layer of a hybrid resist on a semiconductor substrate; and
   d) exposing a first region of the hybrid resist to x-ray radiation through a mask positioned at the first mask-wafer gap.

2. The method of claim 1, additionally comprising the steps of:
   a) selecting a second space width for a second hybrid resist space;
   b) determining a second mask-wafer gap capable of yielding the second space width; and
   c) exposing a second region of the hybrid resist to x-ray radiation through a mask positioned at the second mask-wafer gap.

3. The method of claim 2, wherein the second region of hybrid resist comprises a region that remains photoactive after exposing the first region.

4. The method of claim 1, wherein the step of determining the first mask-wafer gap comprises using an energy profile model indicating an area of hybrid resist that will receive an intermediate level of x-ray radiation.

5. A x-ray lithography method for forming spaces in a resist, the method comprising the steps of:
   a) identifying a process variation capable of necessitating a change in space width upon formation of a hybrid resist space;
   b) determining a change in mask-wafer gap to a modified mask-wafer gap capable of counteracting the process variation;
   c) depositing a layer of a hybrid resist on a semiconductor substrate; and
   d) exposing the hybrid resist to x-ray radiation through a mask positioned at the modified mask-wafer gap.

6. The method of claim 5, wherein the process variation comprises a change in hybrid resist composition or ion implant level.

7. The method of claim 5, wherein the step of determining a change in mask-wafer gap comprises using an energy profile model indicating a change in an area of hybrid resist that will receive an intermediate level of x-ray radiation.

8. A method for forming a hybrid resist space using x-ray lithography comprising the steps of:
   a) selecting a first space width for a first hybrid resist space;
   b) determining a first mask-wafer gap capable of yielding the first space width;
   c) identifying a process variation capable of necessitating a change in space width upon formation of the first hybrid resist space;
   d) determining a change in the first mask-wafer gap to a modified first mask-wafer gap capable of counteracting the process variation;
   e) depositing a layer of a hybrid resist on a semiconductor substrate; and
   f) exposing a first region of the hybrid resist to x-ray radiation through a mask positioned at the modified first mask-wafer gap.

9. The method of claim 8, additionally comprising the steps of:
   a) selecting a second space width for a second hybrid resist space;
   b) determining a second mask-wafer gap capable of yielding the second space width; and
   c) exposing a second region of the hybrid resist to x-ray radiation through a mask positioned at the second mask-wafer gap.

10. The method of claim 9, wherein the second region of hybrid resist comprises a region that remains photoactive after exposing the first region.

11. The method of claim 8, wherein the process variation comprises a change in hybrid resist composition or ion implant level.

12. The method of claim 8, wherein the step of determining the first mask-wafer gap and a change in the first mask-wafer gap comprises using an energy profile model indicating an area of hybrid resist that will receive an intermediate level of x-ray radiation.

13. A method for forming a hybrid resist space using x-ray lithography comprising the steps of:
   a) selecting a first space width for a first hybrid resist space;
   b) determining a first mask-wafer gap capable of yielding the first space width by using an energy profile model indicating an area of hybrid resist that will receive an intermediate level of x-ray radiation;
   c) identifying a process variation capable of necessitating a change in space width upon formation of the first hybrid resist space;
   d) determining a change in the first mask-wafer gap to a modified first mask-wafer gap capable of counteracting the process variation by using an energy profile model indicating a change in the area of hybrid resist that will receive an intermediate level of x-ray radiation;
   e) depositing a layer of a hybrid resist on a semiconductor substrate; and
   f) exposing a first region of the hybrid resist to x-ray radiation through a mask positioned at the modified first mask-wafer gap
   g) selecting a second space width for a second hybrid resist space;
   h) determining a second mask-wafer gap capable of yielding the second space width; and
   i) exposing a second region of the hybrid resist to x-ray radiation through a mask positioned at the second mask-wafer gap, wherein the second region of hybrid resist comprises a region that remains photoactive after exposing the first region.

14. The method of claim 13, wherein the steps of determining the first mask-wafer gap and determining the change in the first mask-wafer gap occur simultaneously.

15. A method for forming a hybrid resist space using x-ray lithography comprising the steps of:
   a) selecting a first space width for a first hybrid resist space;
   b) determining a first mask-wafer gap capable of yielding the first space width;

c) identifying a process variation capable of necessitating a change in space width upon formation of the first hybrid resist space;
d) determining a change in the first mask-wafer gap to a modified first mask-wafer gap capable of counteracting the process variation;
c) depositing a layer of a hybrid resist on a semiconductor substrate;
d) exposing the hybrid resist to x-ray radiation through a mask containing a plurality of shapes, wherein the mask is positioned at the modified first mask-wafer gap such that first portions of said hybrid resist are exposed to a first exposure level, second portions of said hybrid resist are exposed to an second exposure level, and third portions of said hybrid resist are exposed to a third exposure level; and
e) developing the hybrid resist such that the second portions of the hybrid resist are removed, forming the first hybrid resist space.

16. The method of claim 15, wherein the first level of exposure leaves the first portion of hybrid resist photoactive, wherein the second level of exposure leaves the second portion of hybrid resist soluble in developer, and wherein the third level of exposure cross links the third portion of said hybrid resist leaving it insoluble in developer and no longer photoactive.

17. The method of claim 16, additionally comprising the steps of:
a) selecting a second space width for a second hybrid resist space;
b) determining a second mask-wafer gap capable of yielding the second space width; and
c) exposing the hybrid resist to x-ray radiation through a mask positioned at the second mask-wafer gap such that additional portions of the hybrid resist attain an exposure level equivalent to the second portion.

* * * * *